United States Patent [19]
Hidaka

[11] Patent Number: 5,893,728
[45] Date of Patent: Apr. 13, 1999

[54] SEMICONDUCTOR DEVICE HAVING A FLOATING NODE THAT CAN MAINTAIN A PREDETERMINED POTENTIAL FOR LONG TIME, A SEMICONDUCTOR MEMORY DEVICE HAVING HIGH DATA MAINTENANCE PERFORMANCE, AND A METHOD OF MANUFACTURING THEREOF

[75] Inventor: Hideto Hidaka, Hyogo, Japan

[73] Assignee: Mitsubishi Denki Kabushiki Kaisha, Tokyo, Japan

[21] Appl. No.: 08/733,104

[22] Filed: Oct. 16, 1996

Related U.S. Application Data

[62] Division of application No. 08/516,075, Aug. 17, 1995, Pat. No. 5,592,009.

[30] Foreign Application Priority Data

Sep. 1, 1994 [JP] Japan .................................. 6-208680
Feb. 6, 1995 [JP] Japan .................................. 7-17899

[51] Int. Cl.[6] .................................................. H01L 21/84
[52] U.S. Cl. ........................... 438/155; 438/253; 438/454
[58] Field of Search .................................. 438/152, 155, 438/253, 396, 454

[56] References Cited

U.S. PATENT DOCUMENTS

| 5,296,402 | 3/1994 | Ryou | 438/253 |
| 5,355,012 | 10/1994 | Yamaguchi et al. | 257/409 |
| 5,440,161 | 8/1995 | Iwamatsu et al. | 257/349 |
| 5,508,219 | 4/1996 | Bronner et al. | 438/454 |
| 5,525,531 | 6/1996 | Bronner et al. | 438/454 |
| 5,585,284 | 12/1996 | Park | 438/155 |
| 5,631,186 | 5/1997 | Park et al. | 438/155 |

Primary Examiner—Chandra Chaudhari
Attorney, Agent, or Firm—McDermott, Will & Emery

[57] ABSTRACT

In a dynamic random access memory device including an SOI substrate and a field shield isolation region, a p type impurity region is formed between an n type source/drain region of a transistor coupled to a storage node in a dynamic memory cell and an n type impurity region below a field shield electrode A reverse bias voltage is supplied respectively between the p and n type impurity regions, and between the n type source/drain region of the transistor and the p type body region. As a result, leakage current from the n type source/drain region to the p type body region is compensated for by the leakage current from the n type impurity region to the p type impurity region 6 Claims, 19 Drawing Sheets

SEMICONDUCTOR DEVICE HAVING A FLOATING NODE THAT CAN MAINTAIN A PREDETERMINED POTENTIAL FOR LONG TIME, A SEMICONDUCTOR MEMORY DEVICE HAVING HIGH DATA MAINTENANCE PERFORMANCE, AND A METHOD OF MANUFACTURING THEREOF

CROSS REFERENCE TO RELATED APPLICATIONS

This application is a division of application Ser. No. 08/516,075 now U.S. Pat. No. 5,592,009 filed Aug. 17, 1995. This application is related to applications Ser. No. 08/463,795, now U.S. Pat. No. 5,635,744 filed Jun. 5, 1995 and Ser. No. 08/353,276, now abandoned filed Dec. 5, 1994 commonly assigned with the present invention.

BACKGROUND OF THE INVENTION

1. Field of the Invention

The present invention relates to a semiconductor device, a semiconductor memory device, and a method of manufacturing a semiconductor device. More particularly, the present invention relates to a dynamic random access memory (DRAM) formed on an SOI (Silicon-On-Insulator) substrate, and a method of manufacturing thereof.

2. Description of the Background Art

Many semiconductor memory devices called DRAMs are now provided. Such a DRAM requires a storage holding operation (referred to as refresh operation hereinafter), and allows data read out and writing.

FIG. 26 schematically shows a cross-sectional view of a memory cell of a conventional DRAM. Referring to FIG. 26, this memory cell includes one transfer gate transistor (referred to as transistor hereinafter) TR formed of an MOSFET and one memory capacitor (referred to as capacitor hereinafter) C.

Transistor TR includes a pair of N type source/drain regions 20 formed on the surface of a P type semiconductor substrate 100, and a transfer gate electrode 1 formed on the surface of semiconductor substrate 100 with a gate insulation film 100 thereunder. Transfer gate electrode 1 forms word line WL.

Capacitor C includes a capacitor lower electrode (referred to as storage node hereinafter) 51 connected to one of source/drain regions 20, and a capacitor upper electrode (referred to as cell plate hereinafter) 52 formed on lower electrode 51 with a dielectric layer 53 therebetween.

A bit line BL is connected to the other source/drain region 20 in transistor TR.

In the above-described memory cell of a DRAM, charge is stored in capacitor C from bit line BL via transistor TR to store data.

In recent years, transistor technology utilizing an SOI structure is being established. Such a transistor of an SOI structure is characterized in that wiring-substrate capacitance, i.e. wiring capacitance, is reduced, and the operating rate of circuitry is improved. The application of such a transistor into a CMOS provides the advantage of preventing the latch up phenomenon. There are also various advantages such as reduction of the short channel effect of the transistor, and improvement of the current driving capability and the sub threshold characteristics.

Application of an SOI structure into a memory cell of a DRAM is now in research.

However, there was the problem that a refresh operation must be carried out frequently in a conventional DRAM. This problem will be described in detail hereinafter.

A refresh operation is carried out for reasons set forth in the following. A memory cell includes a P type region and an N type region in a semiconductor substrate 100. Leakage current is generated in the junction between the P type region and the N type region. Such a leakage current causes reduction in the stored charge of a memory cell to result in loss of the stored data.

Generation of a leakage current will be described with reference to an equivalent circuit diagram of a memory cell.

FIG. 27 is an equivalent circuit diagram of the memory cell of FIG. 26. Referring to FIG. 27, a memory cell includes a transistor TR and a capacitor C.

Transistor TR is provided between a bit line BL and capacitor C. Transistor TR is turned on/off in response to the potential on word line WL. The node between transistor TR and capacitor C is a storage node 51. Capacitor C receives a cell plate potential Vcp at its cell plate.

In the proximity of the portion where storage node 51 is connected to source/drain region 20 of FIG. 26, a diode D is formed since the N type region and a P type region are connected. Diode D has its cathode connected to storage node 51 to receive a substrate potential VBB at its anode. When charge is stored in capacitor C, the leakage current at the reverse bias of diode D causes the stored charge to be reduced, resulting in loss of data.

FIG. 28 is a graph showing a change in potential V of storage node 51 in a memory cell of the DRAM shown in FIGS. 26 and 27.

The graph of FIG. 28 has potential V plotted along the ordinate, and time t plotted along the abscissa.

Referring to FIG. 28, data of an H level which is the power supply potential Vcc level is initially present due to the stored charge in the memory cell when the stored information towards the memory cell attains an H level. This potential V of storage node 51 is reduced over time according to the leakage current of the memory cell. The memory cell initially storing data of an H level has the charge gradually reduced to an L level if a refresh operation is not carried out.

Potential V falls from the level of Vcc to become lower than Vcc/2.

When reduction in potential V is encountered, a refresh operation must be carried out at a time point of tREF1 where the potential level is higher than the level of Vcc/2 by a predetermined level ΔV corresponding to a sense amplifier detection capability.

Thus, execution of a refresh operation is indispensable in a conventional DRAM. The cycle of executing a refresh operation (corresponding to rREF1) must be increased to simplify control in a DRAM.

SUMMARY OF THE INVENTION

In view of the foregoing, an object of the present invention is to provide a semiconductor device and a semiconductor memory device that can have its refresh characteristics improved by increasing the period of executing a refresh operation, and a method of manufacturing a semiconductor memory device.

According to an aspect of the present invention, a dynamic semiconductor memory device includes an SOI substrate, a word line, a bit line, a first region of a first conductivity type, a transistor, a capacitor, a field shield isolation region, and first and second potential supply sources. The SOI substrate includes an insulation layer buried therein, and an SOI active layer formed on the insulation layer. The word line is formed on the SOI substrate. The bit line is formed on the SOI substrate, crossing the word line. The first region of the first type conductivity is formed within the SOI active layer. The transistor includes a first source/drain region of a second type conductivity formed within the SOI active layer and adjacent to the first region, a body region of the first type conductivity formed within the SOI active layer and adjacent to the first source/drain region a second source/drain region of the second type conductivity formed within the SOI active layer, adjacent to the body region, and coupled to the bit line, a gate insulation film formed on the body region, and a gate electrode formed on the gate insulation film, and coupled to the word line. The capacitor includes a storage node coupled to the first region and the first source/drain region, a dielectric film formed on the storage node, and a cell plate formed on the dielectric film. The field shield isolation region includes a second region of the second conductivity type formed within the SOI active layer and adjacent to the first region, a field shield insulation film formed on the second region, and a field shield electrode formed on the field shield insulation film. The first potential supply source supplies a first potential to the second region. The second potential supply source supplies a second potential different from the first potential so that a reverse bias voltage is applied between the first and second regions, and between the first source/drain region and the body region.

A first region and a first source/drain region of different types of conductivity are provided within the same storage node. The first region is in contact with at least one second region of a different type conductivity in addition to the first source/drain region. The first source/drain region is in contact with at least one body region of a different type conductivity in addition to the first region. Therefore, leakage current is generated due to PN junction in both the regions between the first and second regions, and between the first source/drain region and the body region. Here, the leakage current flows in opposite directions within the same storage node. Leakage current flows in a direction where the stored charge in the storage node attaining a floating state is discharged, and in contrast, current flows in a direction that prevents such discharge of the stored charge. Thus, the refresh characteristics can be improved by preventing discharge of the stored data due to a leakage current in a memory cell, or by increasing the time before such stored data is lost.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention will be described hereinafter with reference to the drawings.

First Embodiment

Figure 1:
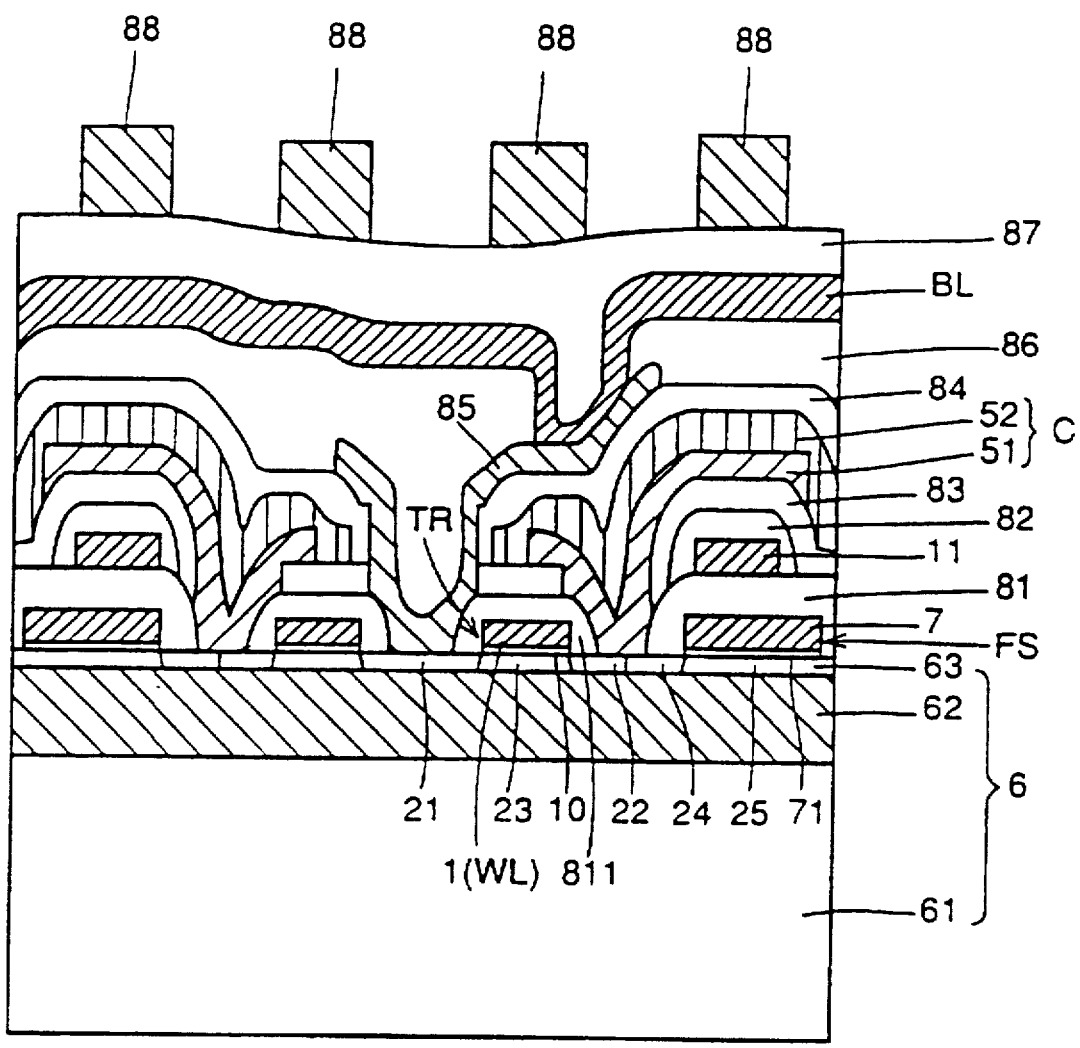
FIG. 1 is a cross-sectional view showing a structure of a memory cell of an SOI structure DRAM according to a first embodiment of the present invention.

FIG. 1 shows a cross-sectional view of a memory cell taken along a bit line BL.

Referring to FIG. 1, an SOI active layer 63 is formed on a silicon substrate 61 with an insulation layer 62 of an oxide film therebetween. An SOI substrate 6 is formed of silicon substrate 61, insulation layer 62, and SOI active layer 63.

On SOI active layer 63, a transfer gate electrode 1 forming a word line (WL) and a field shield gate electrode 7 are disposed with gate insulation films 10 and 71, respectively, thereunder, with a predetermined distance therebetween.

A pair of N$^+$ type source/drain regions 21 and 22 are formed within SOI active layer 63. A body region 23 of a transfer gate transistor (referred to as transistor hereinafter) is formed within SOI active region 63 between source/drain regions 21 and 22. Body region 23 is a P type region. Transfer gate electrode 1 is provided on body region 23 with gate insulation film 10 thereunder.

An N type region 25 is formed below field shield gate electrode 7 with a gate insulation film 71 therebetween. A field shield isolation region FS is formed of field shield gate electrode 7 and region 25. A P type impurity region 24 is formed between one source/drain region 22 and region 25 within SOI active layer 63.

More specifically, in a region of SOI active layer 63 beneath the region between transfer gate electrode 1 and field shield gate electrode 7, one source/drain region 22 is formed at the side of transfer gate electrode 1, and impurity region 24 is formed at the side of field shield gate electrode 7.

Transfer gate electrode 1 and field shield gate electrode 7 are covered with interlayer insulation layers 811 and 81, respectively. Another word line 11 is formed on field shield gate electrode 7 with an interlayer insulation layer 81 thereunder. Word line 11 is covered with an interlayer insulation layer 82. Furthermore, interlayer insulation layer 82 is formed by interlayer insulation layer 83.

A storage node (lower electrode) 51 is connected in common to one source/drain region 22 and impurity region 24. Storage node 51 is formed so as to cover each of transfer gate electrode 1, field shield gate electrode 7 and word line 11.

A cell plate (upper electrode) 52 is formed on storage node 51 with a dielectric film (not shown) therebetween. An interlayer insulation layer 84 is formed on cell plate 52.

An intermediate layer 85 is connected to other source/drain region 21 to form contact with bit line BL. Intermediate layer 85 is formed so as to cover interlayer insulation layers 81 and 84. An interlayer insulation layer 86 is formed on each of intermediate layer 85 and interlayer insulation layer 84.

Bit line BL extends above interlayer insulation layer 86. Bit line BL has a portion connected to intermediate layer 85. Aluminum lines 88, 88, . . . are formed on bit line BL with an interlayer insulation layer 87 therebetween. Aluminum line 88 is partially connected to word line WL to reduce the resistance of word line WL.

The main part of the memory cell of FIG. 1 will be described with reference to the plan view of FIG. 2.

Figure 2:
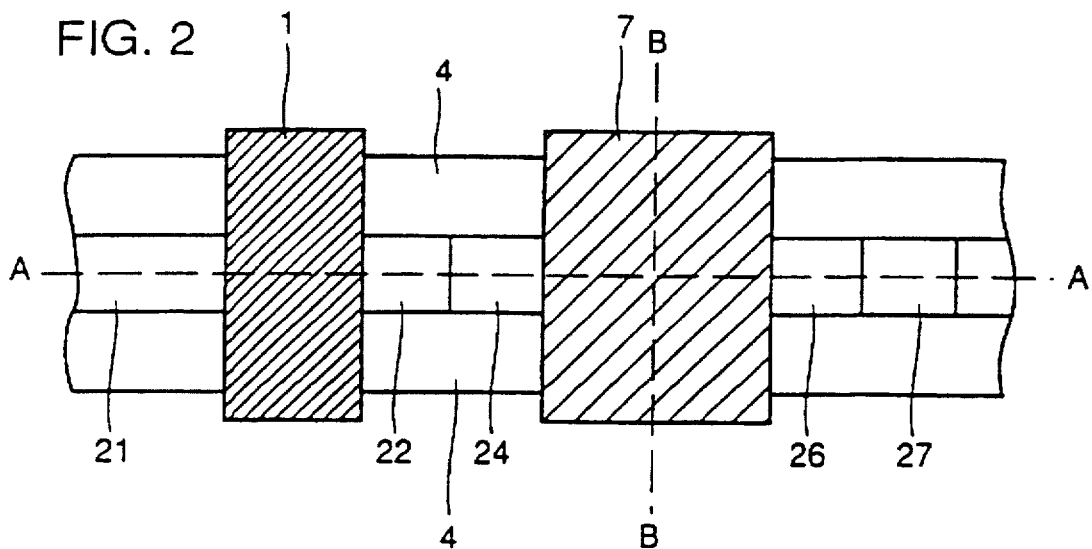
FIG. 2 is a plan view of a portion of the memory cell of FIG. 1.

Referring to FIG. 2, transfer gate electrode 1 and field shield gate electrode 7 extend in parallel. Source/drain regions 21 and 22 are arranged sandwiching transfer gate electrode 1 in a direction perpendicular to the extending direction of transfer gate electrode 1. Impurity regions 24 and 26 are arranged sandwiching field shield gate electrode 7 in a direction perpendicular to the extending direction of field shield gate electrode 7.

One source/drain region 22 and impurity region 24 form contact. Also impurity region 26 and impurity region 77 form contact. Regions 21, 22, 24, 26 and 27 are isolated in a manner sandwiched by device isolation regions 4 extending in a direction perpendicular to the extending direction of transfer gate electrode 1 and field shield gate electrode 7.

Figure 3:
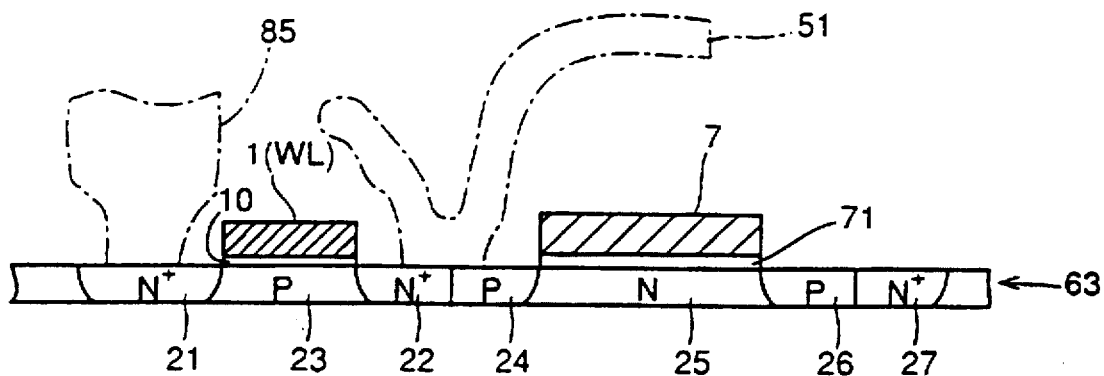
FIGS. 3 and 4 are cross-sectional views of the memory cell of FIG. 2 taken along line A—A and line B—B, respectively.

FIG. 3 is a cross-sectional view showing the main part of a memory cell taken along line A—A of FIG. 2.

Referring to FIG. 3, transfer gate electrode 1 is formed on body region 23 in SOI active layer 63 with gate insulation film 10 therebetween. Field shield gate electrode 7 is formed on region 25 within SOI active layer 63 with a gate insulation film 71 therebetween. Regions 21, 23, 22, 24, 25, 26 and 27 are formed continuously in one direction within SOI active layer 63.

Figure 4:
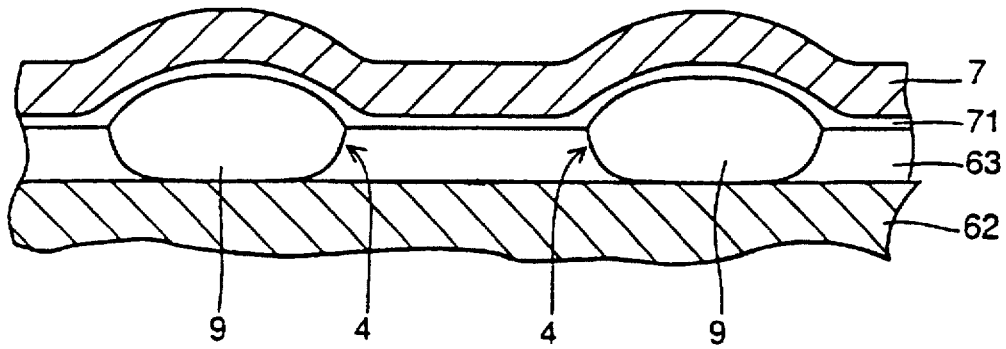

FIG. 4 is a cross-sectional view taken along line B—B of FIG. 2.

Referring to FIG. 4, SOI active layer 63 is formed on insulation layer 62. Field oxide films 9 are formed in device isolation regions 4 of SOI active layer 63. Device isolation regions 4 are formed by applying thermal oxidation partially on SOI substrate 6. Field shield gate electrode 7 is formed on the surface of SOI active layer 63 and field oxide films 9 with a gate oxide film 71 therebetween.

At each crossings of field shield gate electrode 7 and device isolation region 4, field shield gate electrode 7 is arranged above device isolation region 4.

A method of manufacturing a memory cell of the present invention embodiment will be described. Two methods of manufacturing this memory cell will be described. FIG. 5 shows the first manufacturing method.

Figure 5A:
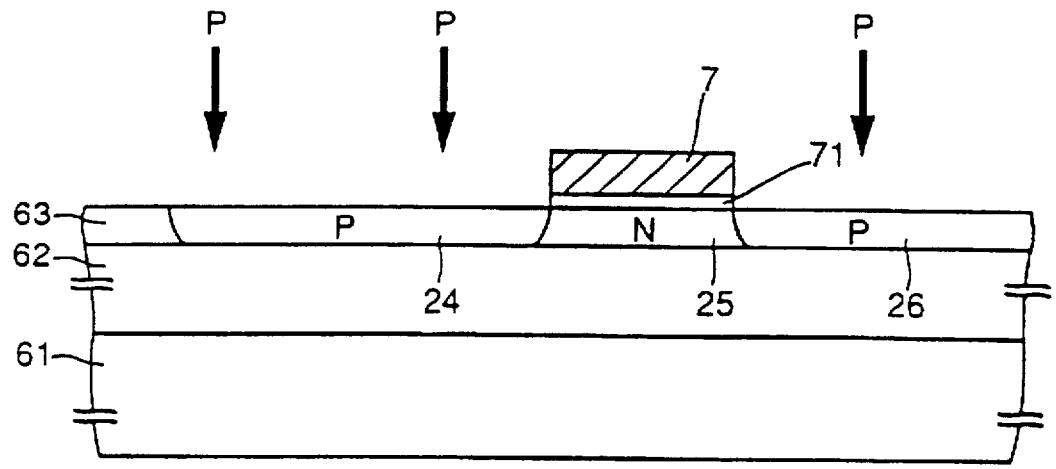
FIGS. 5(a)–5(c) show a first manufacturing method of a memory cell of the present embodiment with sequential manufacturing steps thereof.

Referring to FIG. 5(a), insulation layer 62 and N type SOI active layer 63 are formed on silicon substrate 61.

Field shield gate electrode 7 is formed on a predetermined region of SOI active layer 63 with a gate oxide film 71 thereunder. Field shield gate electrode 7 and gate oxide film 71 are patterned to a predetermined configuration.

Using field shield gate electrode 7 as a mask, P type ions are implanted into SOI active layer 63 to form a pair of P type impurity regions 24 and 26.

Figure 5B:
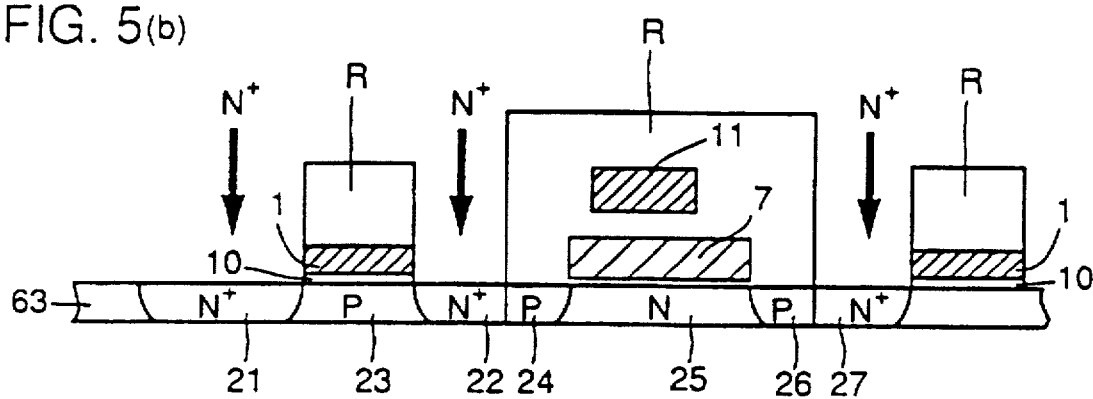
Figure 5C:
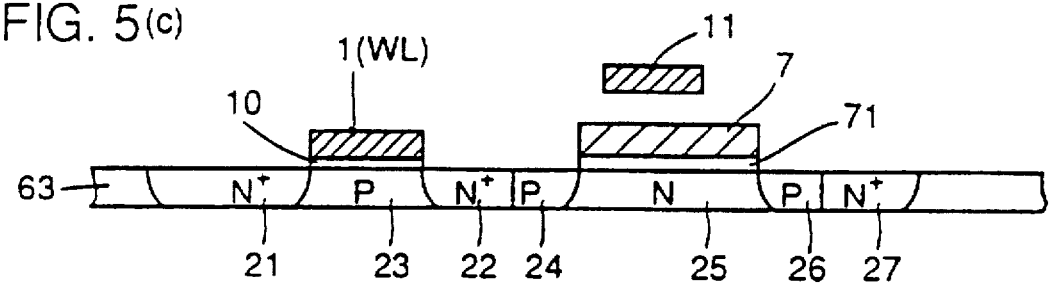

Referring to FIG. 5(b), transfer gate electrodes 1 are formed on impurity regions 24 and 26, respectively. Transfer gate electrodes 1 are patterned to a predetermined configuration. Another transfer gate electrode 11 patterned to a predetermined configuration is formed on field shield gate electrode 7 with an interlayer insulation layer therebetween.

A resist is formed so as to cover transfer gate electrodes 1, field shield gate electrode 7, and transfer gate electrode 11. The resist is patterned as set forth in the following.

Transfer gate electrode 1 is patterned along both sides thereof to result in a resist pattern R remaining on transfer gate electrode 1.

Patterning is carried out so that a resist pattern R remains having a configuration covering partially the surface of each of impurity regions 24 and 26 from both sides of field shield gate electrode 7 and so as to cover field shield gate electrode 7 and transfer gate electrode 11.

Using resist pattern R as a mask, N$^+$ type ions are implanted. As a result, N$^+$ type source/drain regions 21 and 22 defining P type body region 23 are formed within SOI active layer 63. Also, a pair of P type impurity regions 24 and 26 defining N type region 25 are formed.

The ion implantation causes N$^+$ type region 22 and P$^+$ type region 24 to be formed between body region 23 beneath transfer gate electrode 1 and impurity region 25 beneath field shield gate electrode 7. These regions 22 and 24 are in contact.

By removing resist pattern R as shown in (c) in FIG. 5, a memory cell of the structure of FIG. 3 is formed.

A second manufacturing method of the memory cell of the present invention will be described hereinafter with reference to FIG. 6.

Figure 6A:
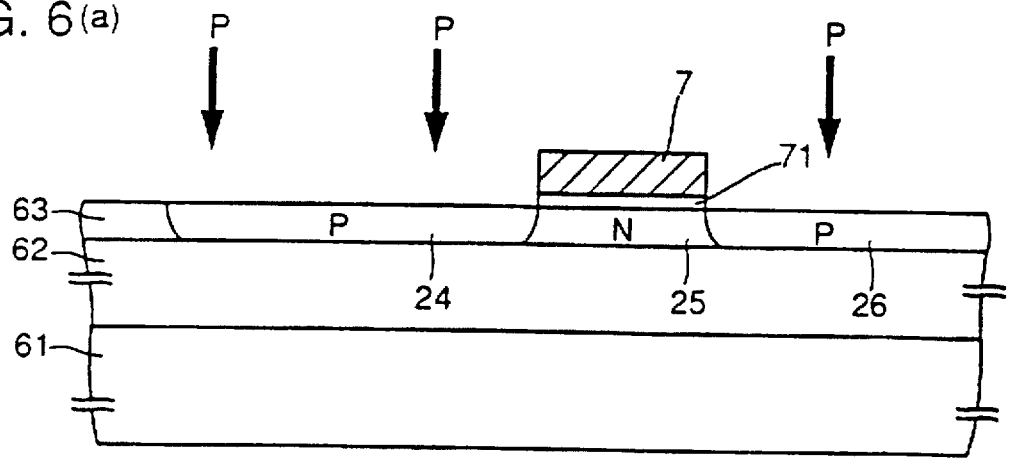
FIGS. 6(a)–6(c) show a second manufacturing method of the memory cell of the present embodiment with sequentially manufacturing steps thereof.
Figure 6B:
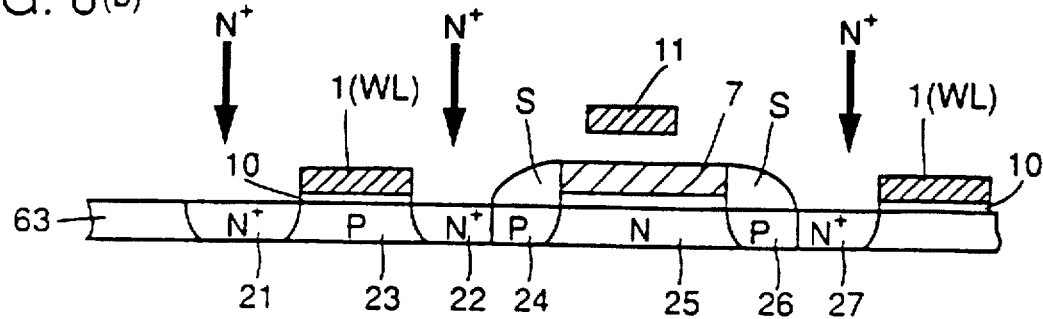
Figure 6C:
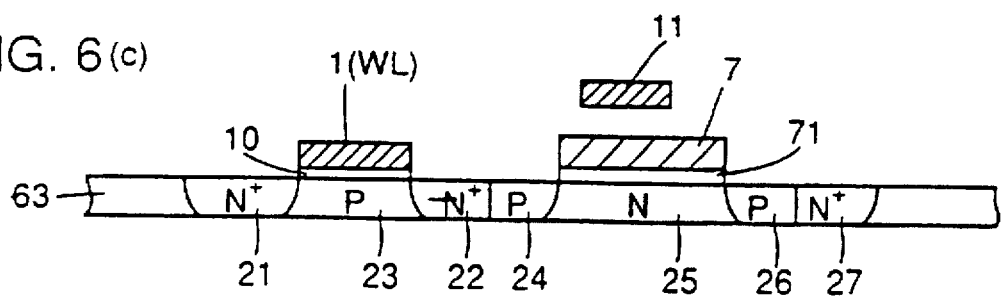

The steps of (a) and (c) of FIG. 6 are similar to those shown in (a) and (c) of FIG. 5. The manufacturing method of FIG. 6 differs from that of FIG. 5 in the manufacturing step of (b).

Following the step of (a) shown in FIG. 6, an oxide film is formed so as to cover field shield gate electrode 7 by, for example, CVD. The oxide film is subjected to anisotropic etching, whereby a sidewall S is formed at the side face of field shield gate electrode 7.

Transfer gate electrodes 1 are formed respectively on impurity regions 24 and 26 with a gate oxide film 10 thereunder. Transfer gate electrodes 1 are patterned to a predetermined configuration. Then, another transfer gate electrode 11 patterned to a predetermined configuration is formed on field shield gate electrode 7 with an interlayer insulation layer therebetween.

Then, N$^+$ type ions are implanted using sidewall S as a mask. As a result, N$^+$ type source/drain regions 21 and 22 defining P type body region 23 are formed within SOI active layer 63. Also, a pair of P type impurity regions 24 and 26 are formed defining N type region 25.

By implanting ions using sidewall S of field shield gate electrode 7 according to the second manufacturing method, the memory cell of FIG. 3 can be formed.

The feature of the operation of the memory cell according to the present invention will be described with reference to an equivalent circuit diagram of FIG. 7.

Figure 7:
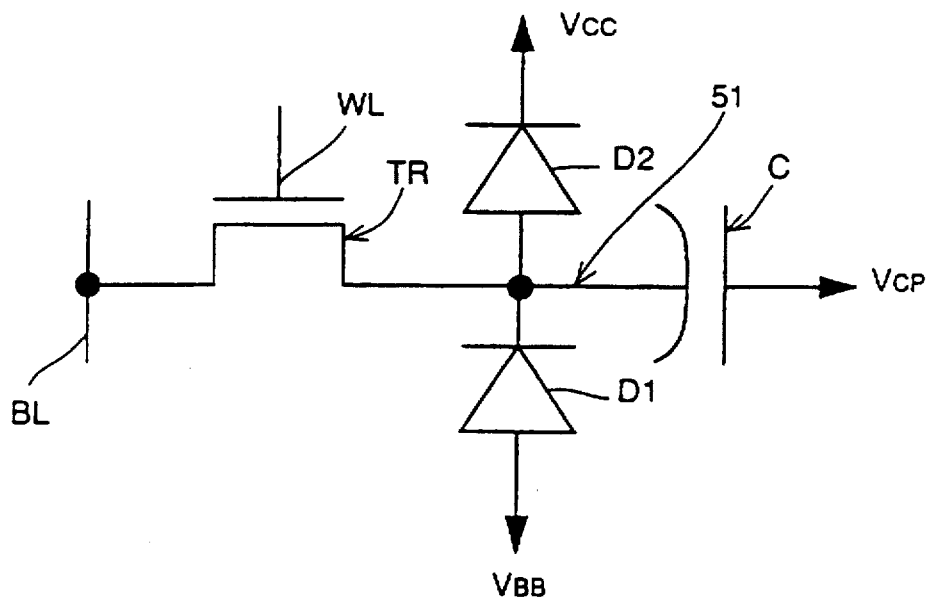
FIG. 7 is an equivalent circuit diagram of a memory cell of the embodiment.

Referring to FIG. 7, a memory cell includes a transfer gate transistor TR, a memory capacitor C, and diodes D1 and D2.

Transistor TR is connected between bit line BL and capacitor C. Transistor TR is operated in response to the potential received by the transfer gate electrode forming word line WL. Capacitor C receives cell plate potential Vcp at its cell plate.

Diodes D1 and D2 are connected to storage node 51 of capacitor C. Diodes D1 and D2 have their anodes connected to storage node 51. Diode D1 receives a substrate potential (L level) VBB at its cathode. Diode D2 receives a power supply potential Vcc at its cathode.

Diode D1 is an element equivalently showing the leakage current of a memory cell generated at the PN junction of N$^+$ type source/drain region 22 and the P type region including body region 23 and a device isolation region.

Diode D2 is an element equivalently showing the leakage current of the memory cell generated at the PN junction of P$^+$ type region 24 and N type region 25. The memory cell shown in FIG. 7 has the charge of an H level (Vcc) or an L level (0 V) stored.

The operation of the equivalent circuit of FIG. 7 will be described hereinafter.

Figure 8:
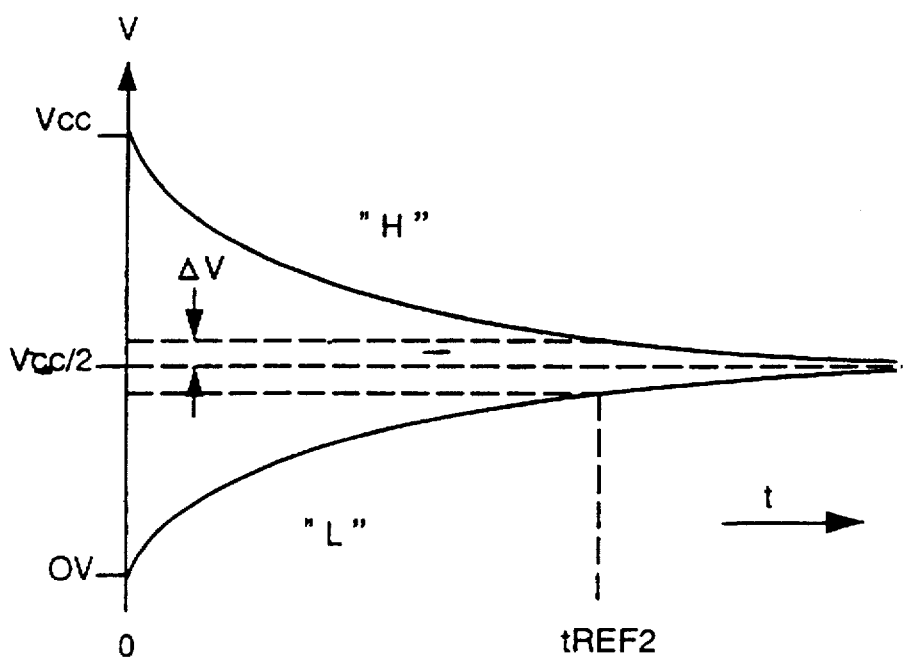
FIG. 8 is a graph showing potential change in a storage node of the memory cell of the present embodiment.

FIG. 8 is a graph showing potential change in storage node 51 of the memory cell of the present embodiment.

The graph of FIG. 8 has potential V of storage node 51 plotted along the ordinate, and time t plotted along the abscissa. There are two types of charge storage states (charge of H level and charge of L level stored in memory cell).

The leakage current of the memory cell will be mainly described hereinafter with reference to FIGS. 7 and 8.

First, the case where charge of an H level (Vcc) is stored in the memory cell will be described. Here, the potential of storage node 51 is Vcc.

When the potential of storage node 51 is Vcc, reverse bias is applied to diode D1. In response, reverse leakage current flows to diode D1. This current is the leakage current of the memory cell generated at the PN junction portion of regions 22 and 23. This leakage current causes the level of potential V of storage node 51 to fall from the level of power supply potential Vcc.

Reduction in the potential of storage node 51 causes reverse bias to be applied to diode D2. Therefore, a weak reverse current is conducted to diode D2. This reverse current is the leakage current of the memory cell generated at the PN junction portion of regions 24 and 25.

When charge of an H level is written into the memory cell, the leakage current of the memory cell indicated by the forward current of diode D1 flows out from storage node 51, and leakage current of the memory cell indicated by the reverse current of diode D2 flows into storage node 51.

Here, the leakage current flowing out is smaller than the leakage current flowing in. In this case, the rising effect of a potential of storage node 51 due to the flowing-in leakage current prevents the fall of the potential of storage node 51 due to the flowing-out leakage current.

As shown by the upper curve of FIG. 8, potential V of storage node 51 gradually falls from the level of Vcc to the level of Vcc/2.

Figure 13:
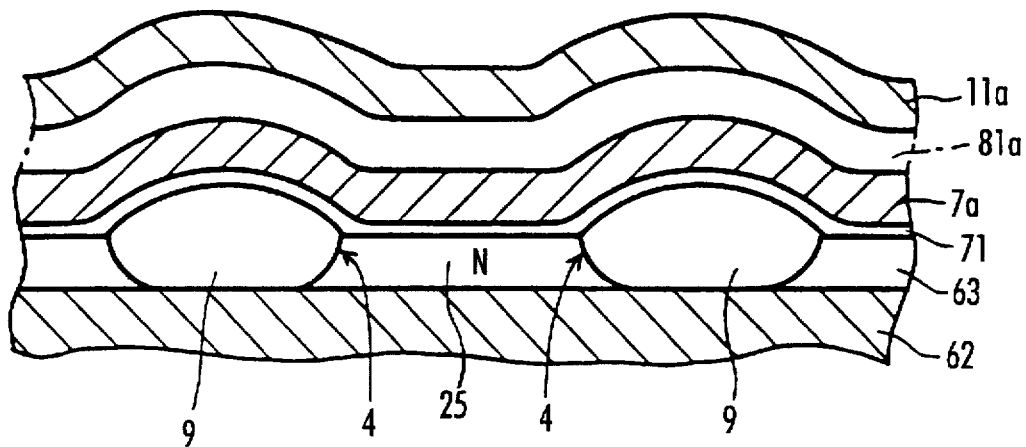

Therefore, the fall of the potential of storage node 51 is more gentle than the fall of the potential of a conventional case shown in FIG. 13. This means that the time tREF2 before potential V of storage node 51 reaches the level of potential (Vcc/2+$\Delta$V) requiring a refresh operation is increased in comparison with that of a conventional DRAM.

Thus, the memory cell of the present embodiment can have the refresh period of executing a refresh operation increased to improve the refresh characteristics.

When charge of an L level (0 V) is stored in the memory cell, the potential of storage node 51 gradually rises from 0 V to Vcc/2 as shown by the lower curve of FIG. 8. Therefore, the refresh characteristics is also improved in this case.

The invention is not limited to the above-described embodiment where a memory cell is shown having a transfer gate transistor formed by an N channel MOS transistor. The present invention is applicable to a memory cell having a transfer gate transistor formed from a P channel MOS transistor.

Another Embodiment of Device Isolation Region

Another embodiment of device isolation regions 4 shown in FIGS. 2 and 4 will be described hereinafter. An isolation method by field oxide film 9 as shown in FIG. 4 is used for device isolation regions 4 in FIG. 2. The element isolation method is not limited to that shown in FIG. 4, and another isolation method of device isolation regions 4 will be described hereinafter with reference to FIG. 9 showing a mesa isolation method.

Figure 9:
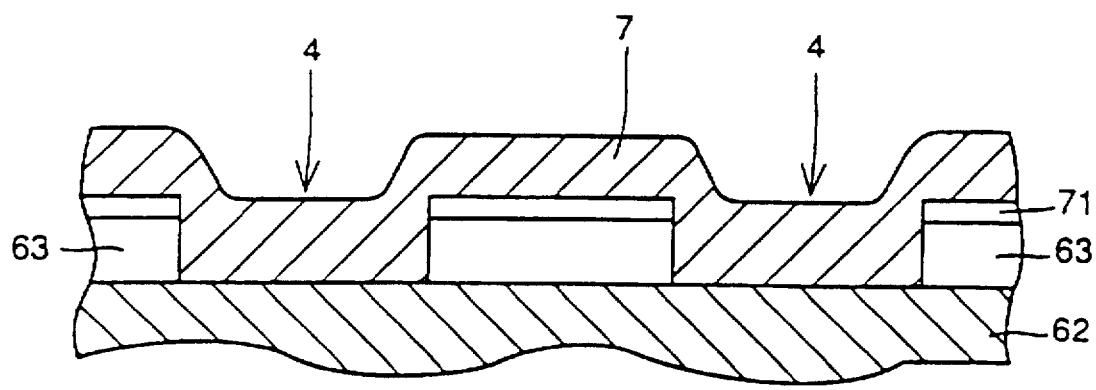
FIG. 9 is a cross-sectional view of a memory cell taken along line B—B of FIG. 2 where another device isolation region according to a mesa isolation method is used.

Referring to FIG. 9 taken along line B—B of FIG. 2, device isolation regions 4 have a structure where SOI active layer 63 is partially patterned. Field shield gate electrode 7 is provided within the patterned region. Here, device isolation regions 4 are formed by partial etching of SOI active layer 63.

Figure 10:
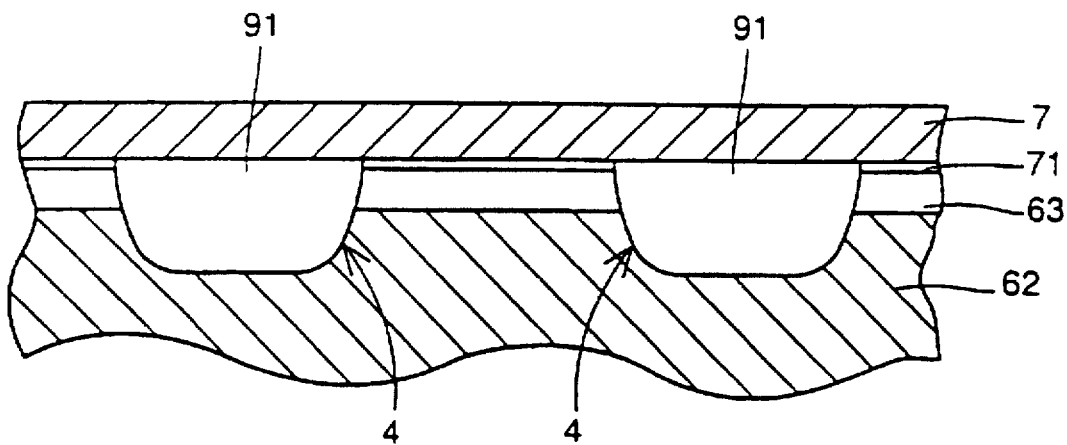
FIG. 10 is a cross-sectional view of a memory cell taken along line B—B of FIG. 2 where another device isolation region according to a trench isolation method is used.

FIG. 10 shows a trench isolation method.

Referring to FIG. 10 taken along line B—B of FIG. 2, buried oxide films 91 are formed in a trench (hole) reaching within insulation layer 62 through gate oxide film 71 and SOI active layer 63. Device isolation regions 4 are formed by partial etching forming a hole through gate insulation film 71 and SOI active layer 63 and reaching insulation layer 62, and a step of filling that hole with buried oxide films 91.

Device isolation regions 4 are not limited to an isolation method using field oxide films 9. Furthermore, it is to be noted that the P type region and the N type region in the first embodiment can be applied to a structure where they are exchanged for each other.

Second Embodiment

The case where a contact portion with respect to a bit line is shared by two adjacent memory cells will be described in the second embodiment.

Figure 11:
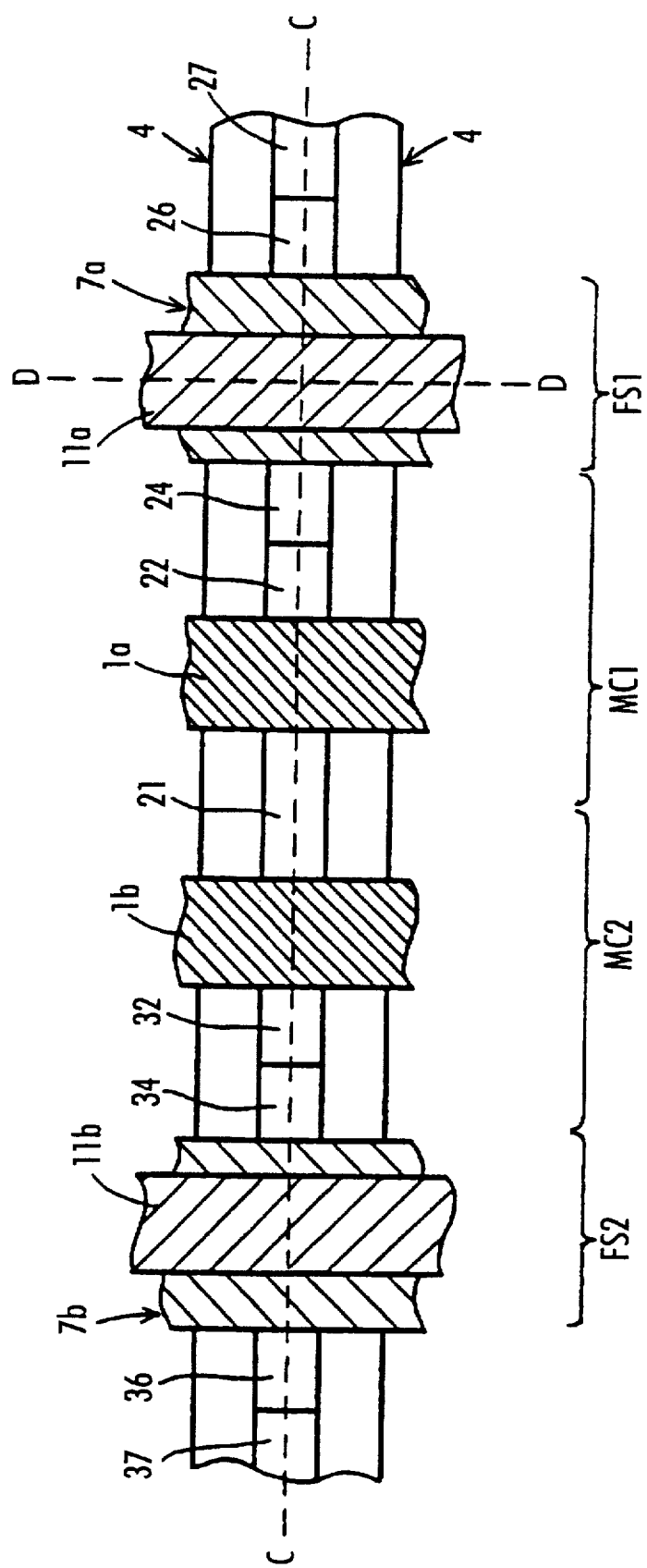
FIG. 11 shows a plan view of a memory cell of an SOI structure DRAM according to a second embodiment.

FIG. 11 is a plan view of a memory cell of an SOI structure DRAM according to the second embodiment. Components in FIG. 11 corresponding to those of FIG. 2 have the same reference characters denoted, and are not otherwise described herein.

The structure shown in FIG. 11 is characterized by source/drain region 21 shared by two memory cells MC1 and MC2. This structure will be described hereinafter.

Two memory cells MC1 and MC2 are disposed adjacent to each other. Field shield isolation regions FS1 and FS2 are disposed so as to sandwich these memory cells MC1 and MC2.

Transfer gate electrode 1a of memory cell MC1, transfer gate electrode 1b of memory cell MC2, field shield gate electrode 7a of field shield isolation region FS1, and field shield gate electrode 7b of field shield isolation region FS2 extend in parallel to each other.

Field shield isolation region FS1 is arranged adjacent to memory cell MC1, and field shield isolation region FS2 is disposed adjacent to memory cell MC2.

Memory cell MC1 includes a transfer gate electrode 1a, source/drain regions 21, 22, and an impurity region 24. Source/drain regions 21 and 22 are N$^+$ type impurity regions disposed at both sides of transfer gate electrode 1b.

P$^+$ type impurity regions 24 and 26 are disposed at both sides of field shield gate electrode 7a in field shield isolation region FS1. Impurity region 24 is connected to source/drain region 22. Impurity region 26 is connected to N$^+$ type source/drain region 27 of another memory cell.

Memory cell MC2 includes a transfer gate electrode 1b, source/drain regions 21, 32, and an impurity region 34. Source/drain region 21 is shared in common by memory cells MC1 and MC2. Source/drain region 32 is an N$^+$ type impurity region.

Source/drain regions 21 and 32 are disposed at both sides of transfer gate electrode 1b. P$^+$ type impurity regions 34 and 36 are disposed at both sides of field shield gate electrode 7b in field shield isolation region FS1. Impurity region 34 is connected to source/drain region 32. Impurity region 36 is connected to N$^+$ type source/drain region 37 of another memory cell.

In a direction crossing the extending direction of field shield gate electrodes 7a and 7b, device isolation regions 4 are disposed so as to sandwich the regions where memory cells MC1, MC2 and field shield isolation regions FS1, FS2 are respectively formed. Other word lines 11a and 11b are disposed so as to cross over field shield gate electrodes 7a and 7b.

Figure 12:
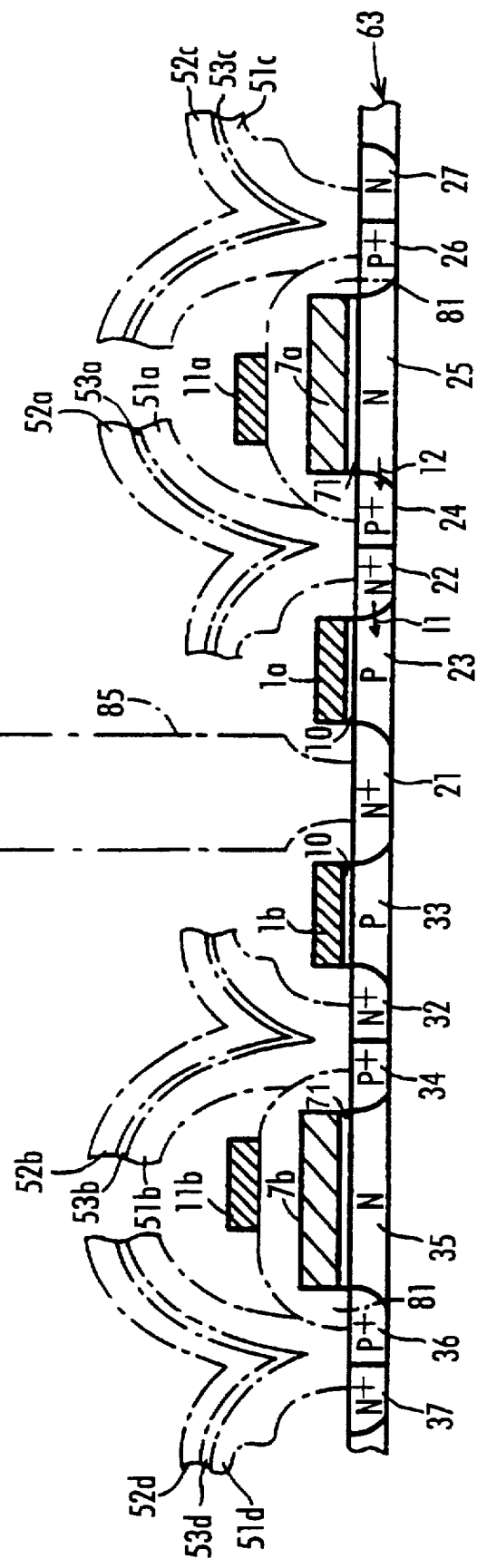
FIGS. 12 and 13 are cross-sectional views of the memory cell of FIG. 11 taken along line C—C and line D—D, respectively.

The structure of the DRAM of FIG. 11 will be described with reference to a cross-sectional view taken along line C—C of FIG. 11. The structure of the main parts of two adjacent memory cell are shown in FIG. 12 in a simple manner. Components of FIG. 12 corresponding to those shown in FIGS. 1 have the same reference characters denoted, and their description will not be repeated.

Referring to FIG. 12, source/drain region 37, impurity regions 36, 35, 34, source/drain region 32, body region 33, source/drain region 21, body region 23, source/drain region 22, impurity regions 24, 25, 26, and source/drain region 27 are disposed in one direction in this order within SOI active layer 63.

N type impurity region 35 is formed between P$^+$ type impurity regions 34 and 36. P type body region 33 is formed between N$^+$ type source/drain regions 21 and 32. P type body region 23 is formed between N$^+$ type source/drain regions 21 and 22. N type impurity region 25 is formed between P$^+$ type impurity regions 24 and 26.

Transfer gate electrode 1a is formed on body region 23 with gate insulation film 10 thereunder. Transfer gate electrode 1b is formed on body region 33 with gate insulation film 10 thereunder. Field shield gate electrode 7a is formed on impurity region 25 with gate oxide film 71 thereunder. Field shield gate electrode 7b is formed on impurity region 35 with gate oxide film 71 thereunder.

Another word line 11a is formed above field shield gate electrode 7a with interlayer insulation layer 81a thereunder. Another word line 11b is formed above field shield gate electrode 7b with interlayer insulation layer 81b thereunder.

Transfer gate electrodes 1a and 1b are covered with interlayer insulation films 811a and 811b, respectively.

Storage node 51a is connected in common to source/drain region 22 and impurity region 24. Storage node 51a is formed so as to cover transfer gate electrode 1a, field shield gate electrode 7a and another word line 11a from above. Cell plate 52a is formed on storage node 51a with dielectric film 53a thereunder.

Similarly, storage node 51b is connected in common on source/drain region 32 and impurity region 34. Cell plate 52b is formed on storage node 51b with dielectric film 53b thereunder.

Similarly, storage node 51c, dielectric film 53c and cell plate 52c are formed above source/drain region 27 and impurity region 26. Also, storage node 51d, dielectric film 53d and cell plate 52d are formed above source/drain region 37 and impurity region 36.

One capacitor is formed of a storage node, a dielectric film, and a cell plate. Therefore, four capacitors are shown in FIG. 12. Bit line BL is formed above the capacitor with an interlayer insulation layer (not shown) thereunder.

Intermediate layer 85 which is a contact portion is formed on source/drain region 21 to obtain contact between upper bit line BL and source/drain region 21. Since source/drain region 21 is shared in common by memory cells MC1 and MC2, intermediately layer 85 is also shared by memory cells MC1 and MC2.

FIG. 13 is a cross-sectional view of the DRAM of FIG. 11 taken along line D—D. The DRAM of FIG. 13 has a structure substantially similar to that of FIG. 4, provided that the formation of another word line 11a on field shield gate electrode 7a with interlayer insulation layer 81a therebetween is shown in detail in FIG. 13.

According to the DRAM of the present second embodiment, two memory cells MC1 and MC2 share in common source/drain region 21 and intermediate layer 85 which is a contact portion of a bit line. The second embodiment is advantageous in that the layout area can be reduced.

Third Embodiment

According to a third embodiment of the present invention, a case is descried where a buffer layer of metal is provided between a storage node and an SOI active layer.

Figure 14:
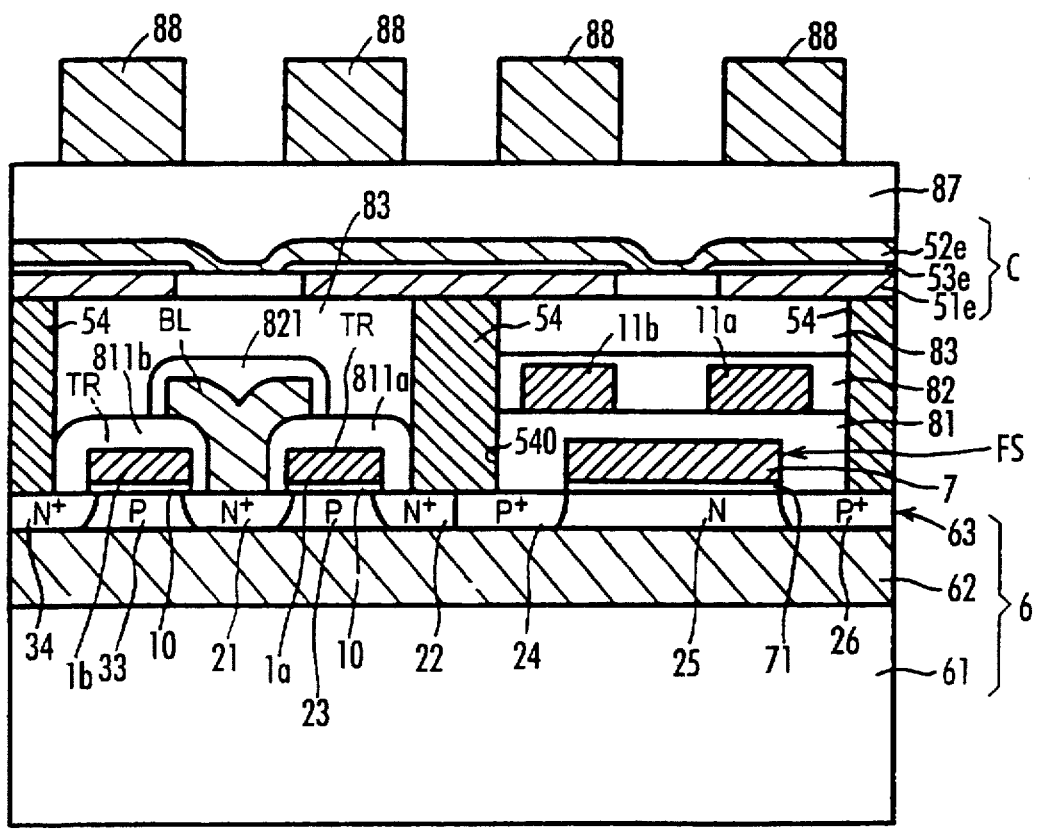
FIGS. 14 and 15 are cross-sectional views showing a structure of a memory cell of an SOI structure DRAM according to a third embodiment and a fourth embodiment, respectively.

FIG. 14 is a cross-sectional view of a memory cell of an SOI structure DRAM of the fourth embodiment. Components in FIG. 14 corresponding to those in FIGS. 1 and 12 have the same reference characters denoted, and their description will not be repeated.

Referring to FIG. 14, the structure within SOI active layer 63 is similar to that of FIG. 12. Bit line BL is formed on interlayer insulation layers 811a and 811b covering transfer gate electrodes 1a and 1b, respectively. Bit lines BL is covered with interlayer insulation layer 821. Interlayer insulation layer 83 is formed on interlayer insulation layers 811a, 811b, and 821.

Two other word lines 11a and 11b are formed on field shield gate electrode 7 with interlayer insulation layer 81 thereunder. Word lines 11a and 11b are covered with interlayer insulation layer 82. Interlayer insulation layer 83 is formed on interlayer insulation layer 82.

Capacitor C is formed on interlayer insulation layer 83. Capacitor C includes storage node 51e, dielectric film 53e, and cell plate 52e. Storage node 51a is formed on interlayer insulation layer 83. Cell plate 52e is formed on storage node 51e with dielectric film 53e thereunder.

Contact hole 540 is formed through a layer located between source/drain region 22, impurity region 24 and storage node 51e. Buffer layer 54 of metal is formed within contact hole 540.

Buffer layer 54 has its lower portion in contact with storage node 22 and impurity region 24, and its upper portion in contact with storage node 51e. Buffer layer 54 is formed of a metal such as tungsten or titanium.

The provision of buffer layer 54 of metal between storage node 51e and source/drain region 22, impurity region 24 provides the advantage that ohmic contact of storage node 51e with source/drain region 22 and impurity region 24 can easily be obtained in the DRAM.

Fourth Embodiment

The fourth embodiment is a modification of the structure of the third embodiment.

Figure 15:
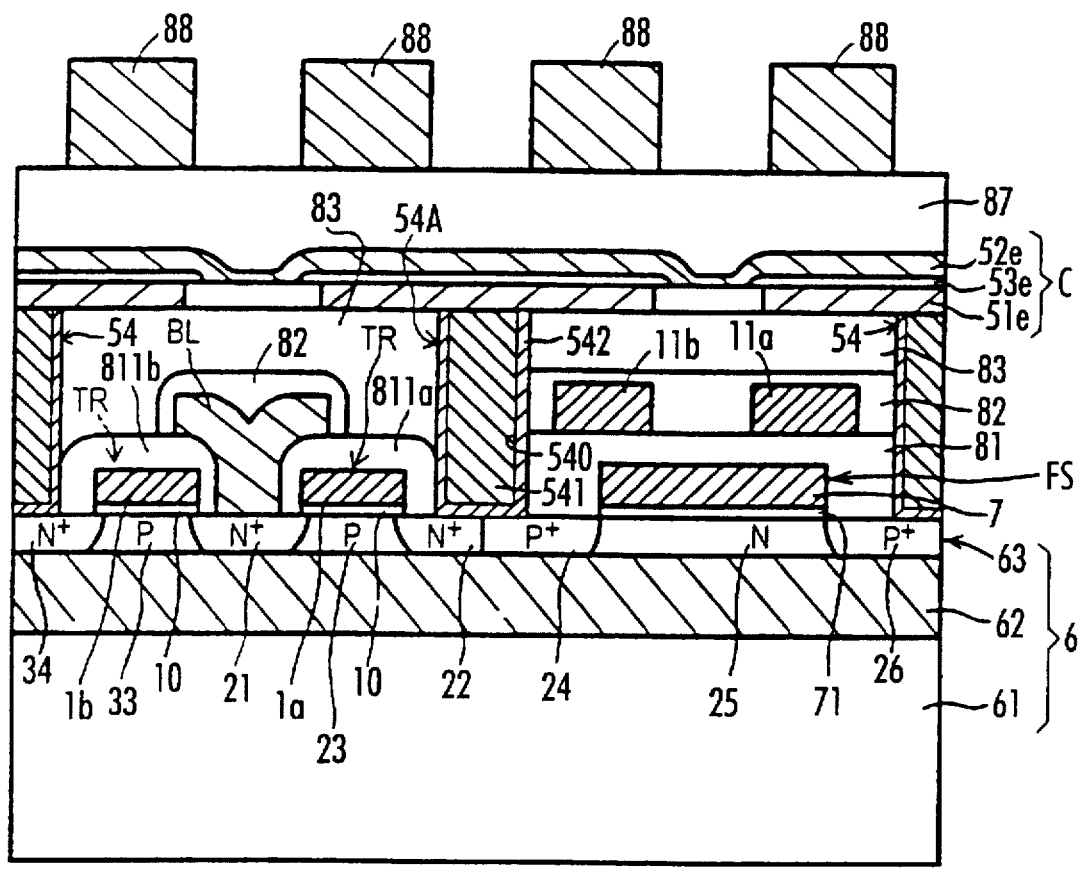

FIG. 15 shows a cross-sectional view of a memory cell according to the fourth embodiment. Components of FIG. 15 corresponding to those shown in FIG. 14 have the same reference characters denoted, and their description will not be repeated.

The DRAM of FIG. 15 differs from that of FIG. 14 in the structure of a buffer layer 54A. Buffer layer 54A corresponds to buffer layer 54 of FIG. 14. Buffer layer 54A includes a polysilicon body 541 and a metal body 542. Metal body 542 is formed of a metal such as tungsten or titanium. Metal body 524 has a cylindrical configuration with one end including an opening and the other end closed.

Metal body 542 has its closed end portion in contact with source/drain region 22 and impurity region 24, and its open portion in contact with storage node 51e. Polysilicon body 541 is formed of polysilicon, and fills the interior of metal body 542.

Similar to buffer layer 54 of the third embodiment, buffer layer 54a can easily obtain ohmic contact of storage node 51e with source/drain region 22 and impurity region 24. This is because buffer layer 54a includes a metal body 542 between storage node 51e and source/drain region 22 and impurity region 24.

In the above embodiment, a double buffer layer of polysilicon body 541 and metal body 542 may be formed of different types of metals such as titanium and tungsten.

Fifth Embodiment

A structure of the fifth embodiment will be described hereinafter where a predetermined potential can be applied to an impurity region beneath the field shield gate electrode of each field shield region shown in the second embodiment.

Figure 16:
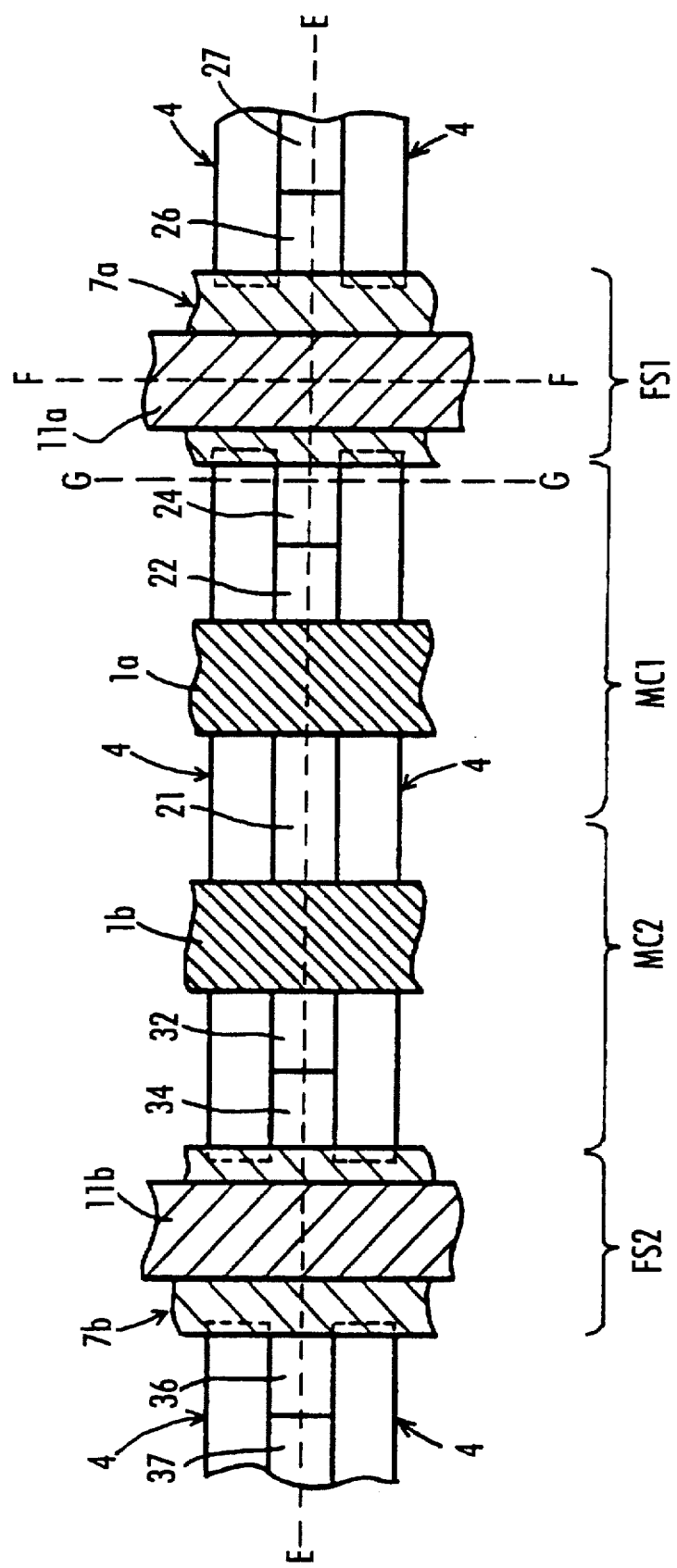
FIG. 16 is a plan view showing a structure of a memory cell of an SOI structure DRAM according to a fifth embodiment.

FIG. 16 is a plan view showing a structure of a memory cell of an SOI structure DRAM according to FIG. 5. Components of FIG. 16 corresponding to those in FIG. 11 have the same reference characters denoted, and their description will not be repeated.

The DRAM of FIG. 16 differs from that of FIG. 11 in the structure of a portion below each of field shield gate electrodes 7a and 7b. More specifically, device isolation regions 4 are not formed below field shield gate electrodes 7a and 7b. The remaining elements of the DRAM of FIG. 16 are similar to those shown in FIG. 11. Therefore, the structure of the cross-sectional view of the DRAM taken along line E—E of FIG. 16 is similar to that shown i FIG. 12.

The structure of the portion beneath each of field shield gate electrodes 7a and 7b will be described with reference to FIG. 17 which is a cross-sectional view taken along line F—F of FIG. 16. Components of FIG. 17 corresponding to those of FIG. 12 have the same reference characters denoted, and their description will not be repeated.

Figure 17:
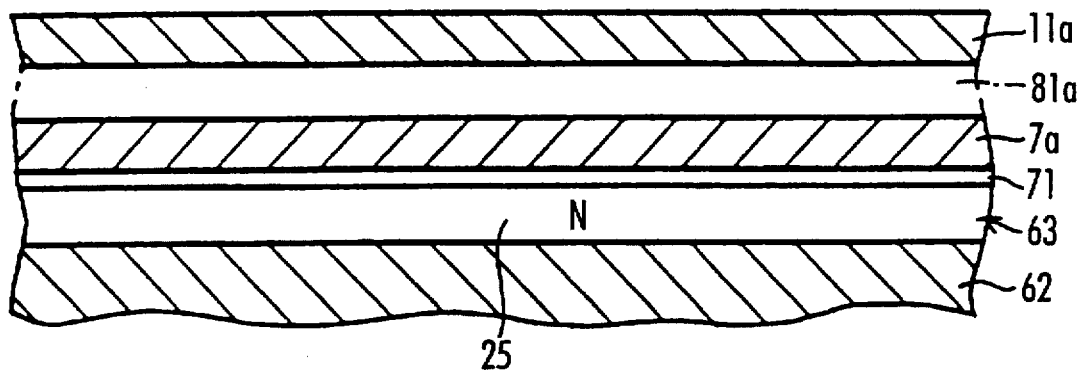
FIGS. 17 and 18 are cross-sectional views of the memory cell of FIG. 16 taken along line F—F and line G—G, respectively.

The sectional structure of FIG. 17 differs from that of FIG. 13 in the absence of a field oxide film. Referring to FIG. 17, SOI active layer 63, gate insulation film 71, field shield gate electrode 7a, interlayer insulation layer 81, and another word line 11a are sequentially formed on insulation layer 62. The structure of the portion below field shield gate electrode 7b is similar to that of FIG. 17.

The structure of the portion where device isolation regions 4 are formed in the proximity of the portion beneath field shield gate electrodes 7a and 7b will be described with reference to the cross-sectional view of FIG. 18 taken along line G—G of FIG. 16.

Figure 18:
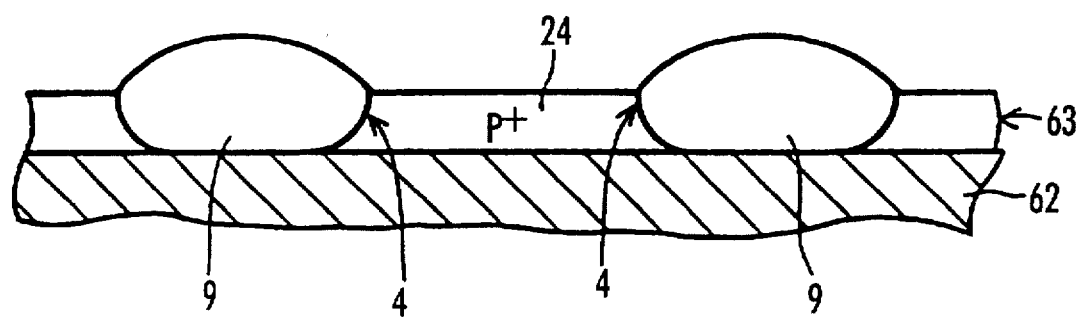

Components of FIG. 18 corresponding to those of FIG. 13 have the same reference characters denoted, and their description will not be repeated.

The sectional structure of FIG. 18 differs from that of FIG. 13 in the absence of gate oxide film 71, field shield gate electrode 7a, interlayer insulation layer 81a, and another word line 11a, and the presence of impurity region 24 within SOI active layer 63 sandwiched by field oxide films 9. The structure of the portion where device isolation regions 4 are formed in the proximity of the portion beneath field shield gate electrode 7b is similar to that of FIG. 18.

Since device isolation regions 4 are not provided beneath field shield gate electrodes 7a and 7b, impurity region 25 below field shield gate electrode 7a and impurity region 35 below field shield gate electrode 7b respectively extend along the extending direction of a corresponding field shield gate electrode.

By applying a potential at the extending end portions of impurity regions 25 and 35, the potential thereof can be fixed to a predetermined potential. This means that a potential of an appropriate level can be applied to impurity regions 25 and 35 to suppress reduction of charge due to a leakage current.

A modification of device isolation regions 4 will be described hereinafter. Device isolation regions 4 shown in FIG. 16 is obtained by the isolation method of field oxide films 9 as shown in FIG. 18. The present invention is not limited to that isolation method, and other isolation methods may be employed.

Figure 19:
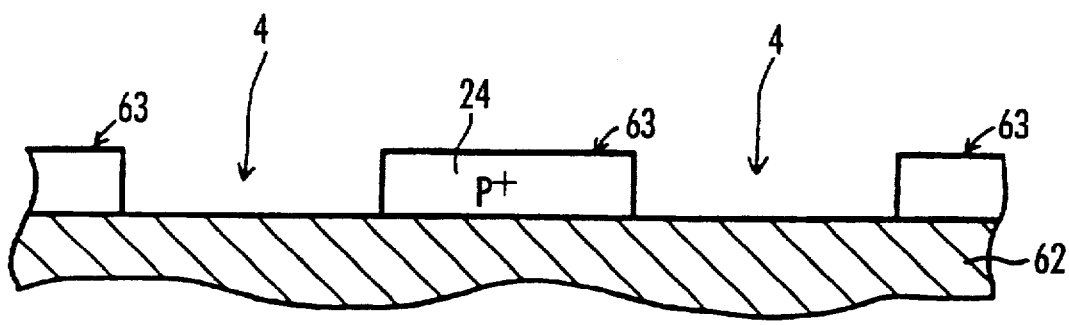
FIGS. 19 and 20 are cross-sectional views of the memory cell of FIG. 16 taken along line G—G where other device isolation regions are used according to a mesa isolation method and a trench isolation method, respectively.

FIG. 19 is a cross-sectional view of a DRAM taken along line G—G of FIG. 16 where a mesa isolation method is employed.

Referring to FIG. 19, device isolation regions 4 have a structure in which SOI active layer 63 is partially patterned. Here, device isolation regions are formed by partially etching SOI active layer 63.

Figure 20:
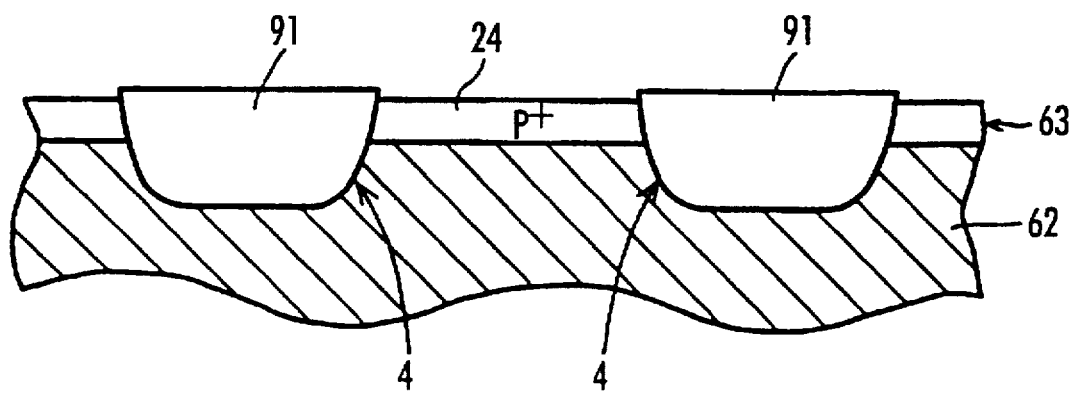

FIG. 20 is a cross-sectional view of a DRAM taken along line G—G of FIG. 16 where a trench isolation method is used.

Referring to FIG. 20, buried oxide films 91 are formed in a trench (hole) through SOI active layer 63 and reaching insulation layer 62 as device isolation regions 4. Device isolation region 4 is formed by an etching step of piercing SOI active layer 63 to form a hole reaching insulation layer 62, and a step of filling that hole with buried oxide film 91.

Sixth Embodiment

A specific structure of applying a potential to an impurity region beneath a field shield gate electrode of each field shield isolation region shown in FIG. 5 will be described hereinafter.

Figure 21:
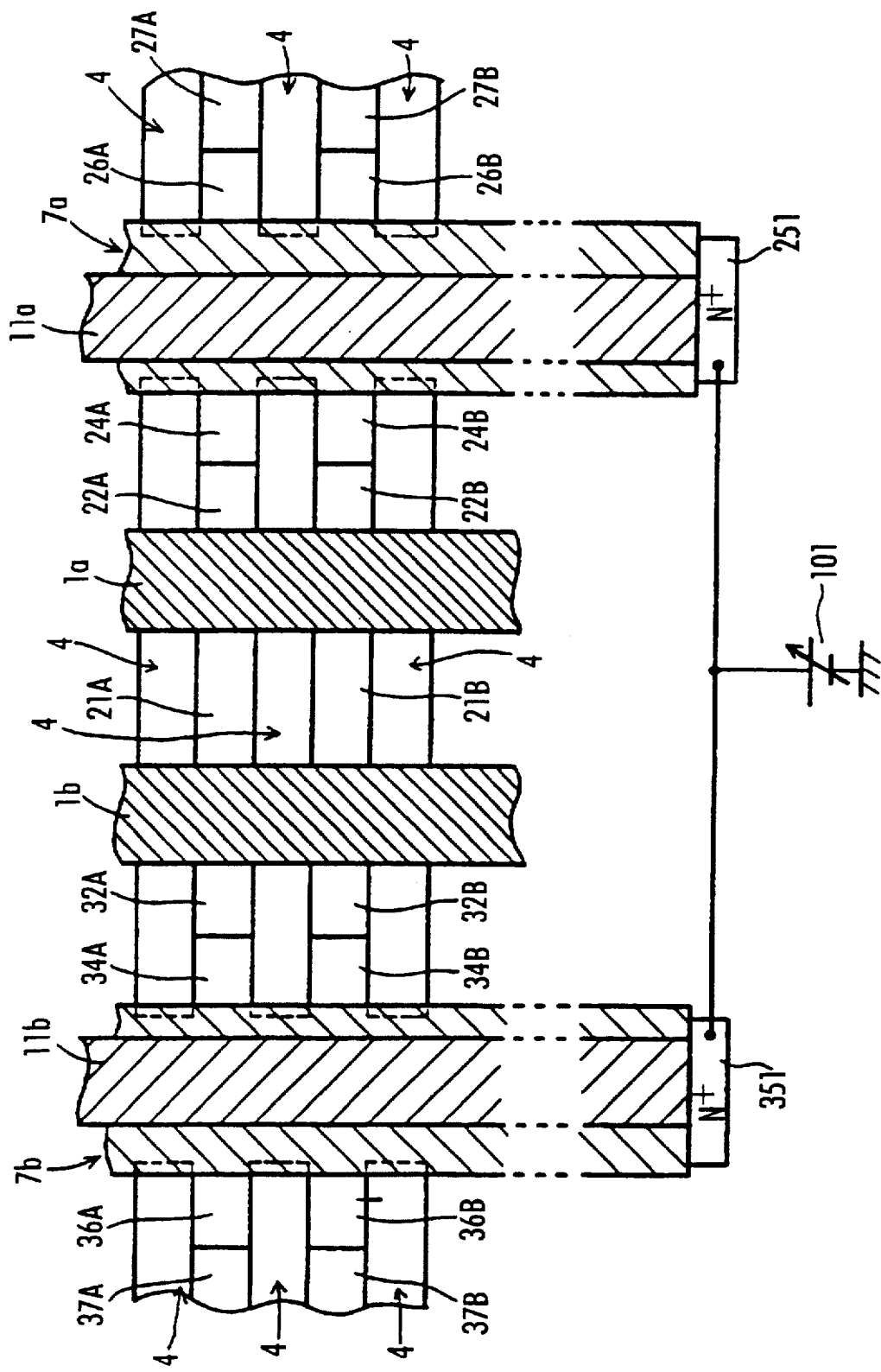
FIG. 21 shows a plan view of a memory cell of an SOI structure DRAM according to a sixth embodiment.

FIG. 21 is a plan view showing a structure of a memory cell of an SOI structure DRAM according to the sixth embodiment. The components of FIG. 21 corresponding to those of FIG. 16 have the same reference characters denoted, and their description will not be repeated.

The difference of the DRAM of FIG. 21 from that of FIG. 16 is set forth in the following. Memory cells are arranged in a plurality of rows and columns, and two rows of memory cells are shown as a portion thereof. When taken in a plane, the two rows include a row in which impurity regions 37A, 36A, 34A, source/drain regions 32A, 21A, 22A, and impurity regions 24A, 26A, and 27A are disposed in order, and a row in which impurity regions 37B, 36B, 34B, source/drain regions 32B, 21B, 22B, and impurity regions 24B, 26B, 27B are disposed in order.

Each row is electrically isolated by impurity regions 4. It is to be noted that device isolation region 4 is not provided in the portion beneath the field shield gate electrode of each row. For example, device isolation regions 4 are not formed in the region beneath each of field shield gate electrodes 7a and 7b.

Therefore, the N type impurity region which is the portion beneath each of field shield gate electrodes 7a and 7b are continuous over several rows along the extending direction of a corresponding field shield gate electrode.

A potential supply circuit 101 is provided at the side of one ends in the extending direction of field shield gate electrodes 7a and 7b. Potential supply circuit 101 can adjust the setting level of the supplied potential. Potential supply circuit 101 supplies potential of positive polarity.

Regions 251 and 351 which are one end portions of respective impurity regions beneath the extending field shield gate electrodes 7a and 7b are of an $N^+$ type conductivity. Each of regions 251 and 351 receive a potential supplied from potential supply circuit 101.

The structure of one side end of respective impurity regions below extending field shield gate electrodes 7a and 7b will be described hereinafter. The structure of the side of field shield gate electrode 7a will be typically described.

Figure 22:
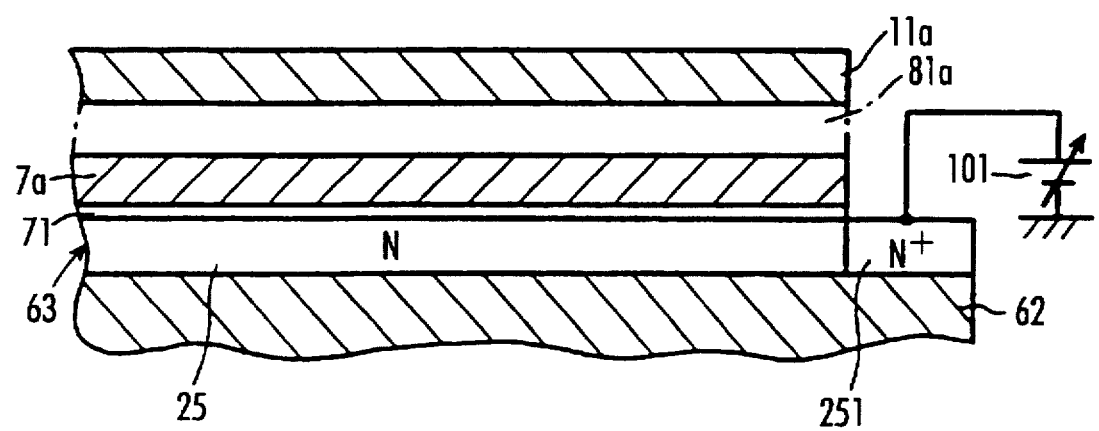
FIG. 22 shows a cross-sectional view of one end of the extending direction of the field shield gate electrode of FIG. 21.

FIG. 22 is a cross-sectional view of the field shield gate electrode 7a of FIG. 21 showing one end in the extending direction thereof. The components of FIG. 22 corresponding to those of FIG. 17 have the same reference characters denoted, and their description will not be repeated.

The difference of the sectional structure of FIG. 22 from that of FIG. 17 is set forth in the following. The conductivity type of region 251 beside SOI active layer 63 is the $N^+$ type. Gate insulation film 71, field shield gate electrode 7a, interlayer insulation layer 81a, and another word line 11a are not formed on region 251. The structure of the portion beside field shield gate electrode 7b is similar to that of FIG. 22.

By employing the above-described structure, the potential of impurity regions 25 and 35 below field shield gate electrodes 7a and 7b in each row can be fixed to a predetermined level in a DRAM of the sixth embodiment.

Therefore, a potential of an approximate level can be applied to impurity regions 25 and 35 via regions 251 and 351 from potential supply circuit 101 in order to suppress reduction of stored charge due to leakage current in each memory cell.

Seventh Embodiment

A structure is described of applying a potential to a body region beneath a transfer gate electrode in each row in addition to the structure of the previous sixth embodiment where a potential is applied to an impurity region beneath a field shield gate electrode of a field shield isolation region in each row.

Figure 23:
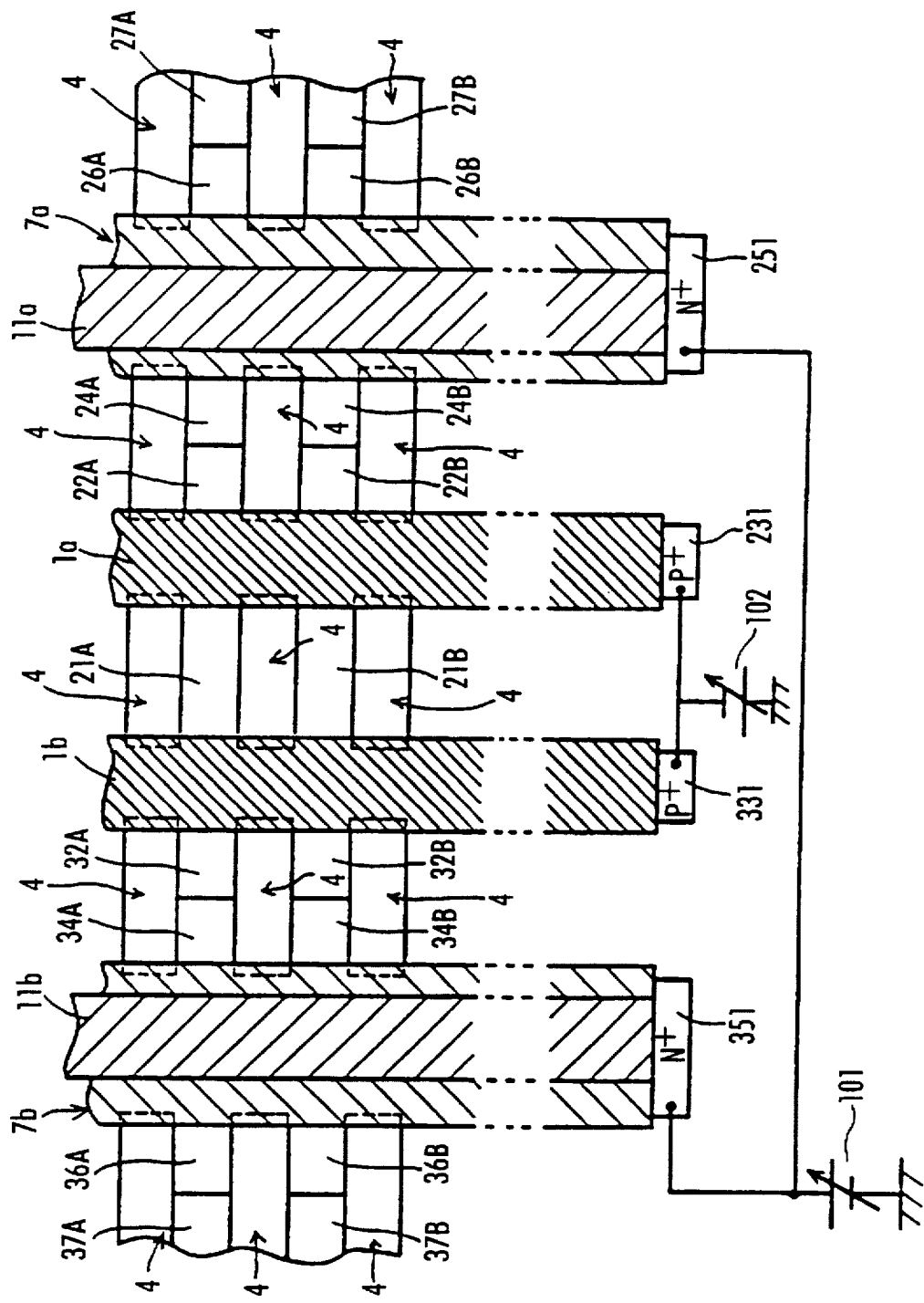
FIG. 23 is a plan view showing a structure of a memory cell of an SOI structure DRAM according to a seventh embodiment.

FIG. 23 is a plan view showing a structure of a memory cell of an SOI structure DRAM according to the seventh embodiment. Components of FIG. 23 corresponding to those of FIG. 22 have the same reference characters denoted, and their description will not be repeated.

The difference of the DRAM of FIG. 23 from that of FIG. 22 is set forth in the following. Device isolation regions 4 are not formed in the portion beneath the transfer gate electrodes of each row. For example, device isolation regions 4 are absent in the portion beneath each of transfer gates 1a and 1b.

Therefore, the P type body region which is the portion below transfer gate electrodes 1a and 1b is continuous over several rows along the extending direction of a corresponding transfer gate electrode.

Potential supply circuit 102 is provided at the side of one end of the extending direction of each of transfer gate electrodes 1a and 1b. Potential supply circuit 102 allows adjustment of the setting level of the applied potential. Potential supply circuit 102 supplies a potential of negative polarity. Regions 231 and 331 at one end of the respective body regions below extending transfer gate electrodes 1a and 1b are of the $P^+$ type conductivity. Each of regions 231 and 331 receives potential from potential supply circuit 102.

The structure at one end side of the body region beneath extending transfer gate electrodes 1a and 1b will be described. The structure of the side end of transfer gate electrode 1a is typically described.

Figure 24:
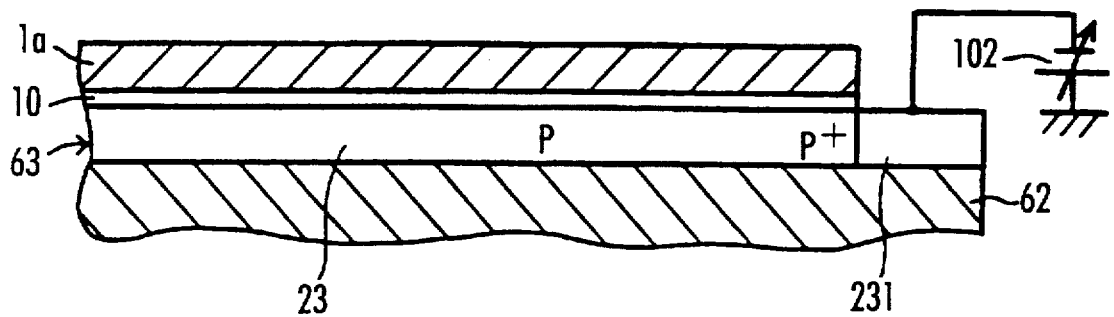
FIG. 24 is a cross-sectional view of one end of the memory cell of FIG. 23 in the extending direction of the transfer gate electrode.

FIG. 24 is a cross-sectional view of the DRAM of FIG. 23 showing one end portion in the extending direction of transfer gate electrode 1a. The components of FIG. 24 corresponding to those of FIG. 23 have the same reference characters denoted, and their description will not be repeated.

Referring to FIG. 24, gate insulation film 10 and transfer gate electrode 1a are formed on P type body region 23 in SOI active layer 63. Region 231 continuous to body region 23 is of a $P^+$ type conductivity at the end portion of SOI active layer 63. Gate insulation film 10 and transfer gate electrode 1a are not formed on region 231. The structure of the side portion of transfer gate electrode 1b is similar to that shown in FIG. 24.

By employing the above-described structure, a potential of a predetermined level can be provided to body regions 23 and 33 beneath transfer gate electrodes 1a and 1b, respectively, of each row in the DRAM of the seventh embodiment, in addition to fixing the potential of impurity regions 25 and 35 beneath field shield gate electrode 7a and 7b, respectively, of each row to a predetermined level.

Therefore, a potential of an appropriate level can be applied to impurity regions 25 and 35 via impurity regions 251 and 351 from potential supply circuit 101 to suppress reduction in the stored charge due to leakage current.

Furthermore, a potential of an appropriate level can be applied to body regions 23 and 33 via regions 231 and 331 from potential supply circuits 102 to suppress reduction of the stored charge due to leakage current in each memory cell.

A method of adjusting the bias voltage in the region within the SOI active layer and a method of adjusting the impurity concentration for the purpose of suppressing reduction of stored charge in a memory cell due to leakage current in the DRAMs of the first to seventh embodiments will be described hereinafter In order to prevent the stored charge in a memory cell from being reduced due to a leakage current, the current flowing out from a connected region beneath a storage node of a memory cell should balance with the current flowing thereto.

The DRAM of FIG. 12 is taken as an exemplary device. In the region where $N^+$ type source/drain region 22 and $P^+$ type impurity region 24 are provided beneath storage node 51a, a current I1 flowing out and a current I2 flowing in (refer to FIG. 12) should balance.

Currents I1 and I2 are indicated by the following equations (1) and (2), respectively.

$$I1 = f1(P, N^+) \cdot (e^{Y1V1} - 1) \quad (1)$$

$$I2 = f2(P^+, N) \cdot (e^{Y2V2} - 1) \quad (2)$$

In equation (1), f1(P, $N^+$) is a function having the current component determined with respective impurity concentrations of body regions 23 and source/drain region 22 as parameters. Y1 is a coefficient determined depending upon respective impurity concentrations of body region 23 and source/drain region 22. V1 is a reverse bias voltage value across P type body region 23 and $N^+$ type source/drain region 22.

In equation (2), f2($P^+$, N) is a constant having the current component determined with respective impurity concentrations of impurity regions 24 and 25 as parameters. Y2 is a coefficient determined by respective impurity concentrations of impurity regions 24 and 25. V2 is a reverse bias voltage value between impurity regions 24 and 25.

Figure 25:
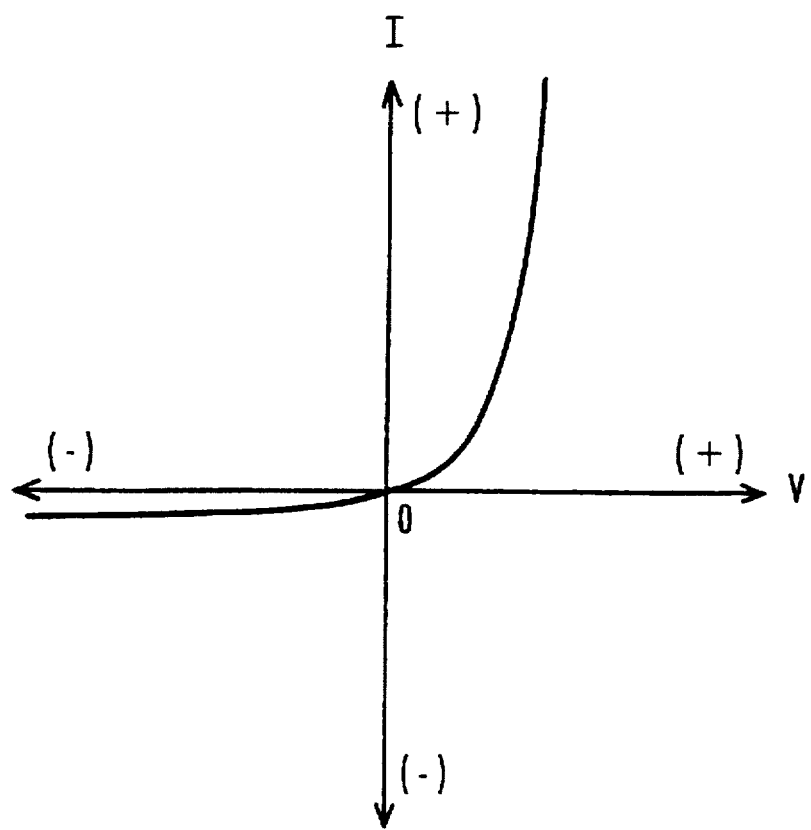
FIG. 25 is a graph showing the relationship between an applied voltage of the diode and a current flowing to the diode.
Figure 26:
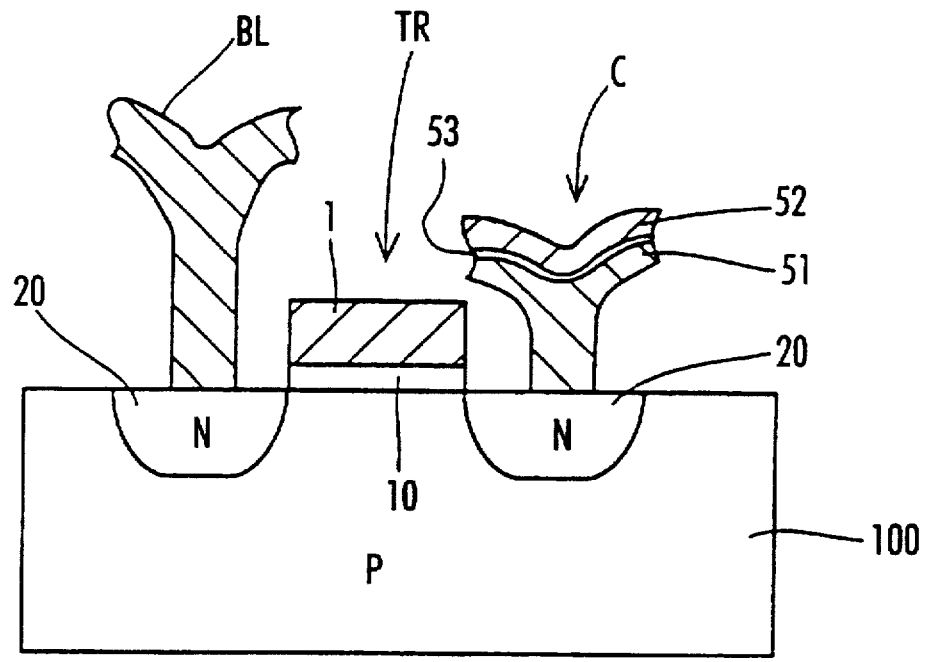
FIG. 26 is a cross-sectional view schematically showing a memory cell of a conventional typical DRAM.
Figure 27:
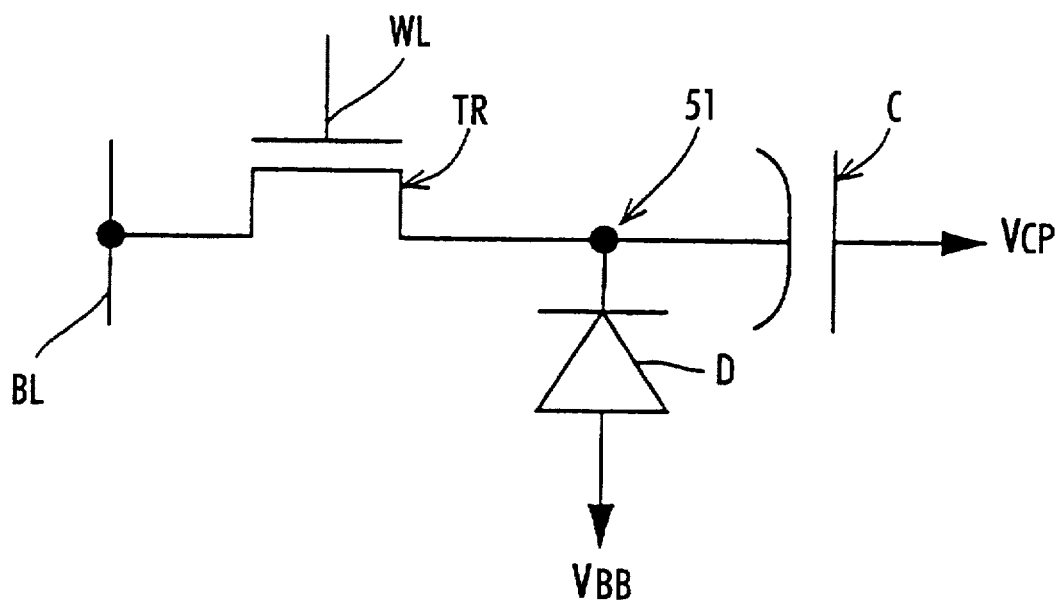
FIG. 27 is an equivalent circuit diagram of the memory cell of FIG. 26.
Figure 28:
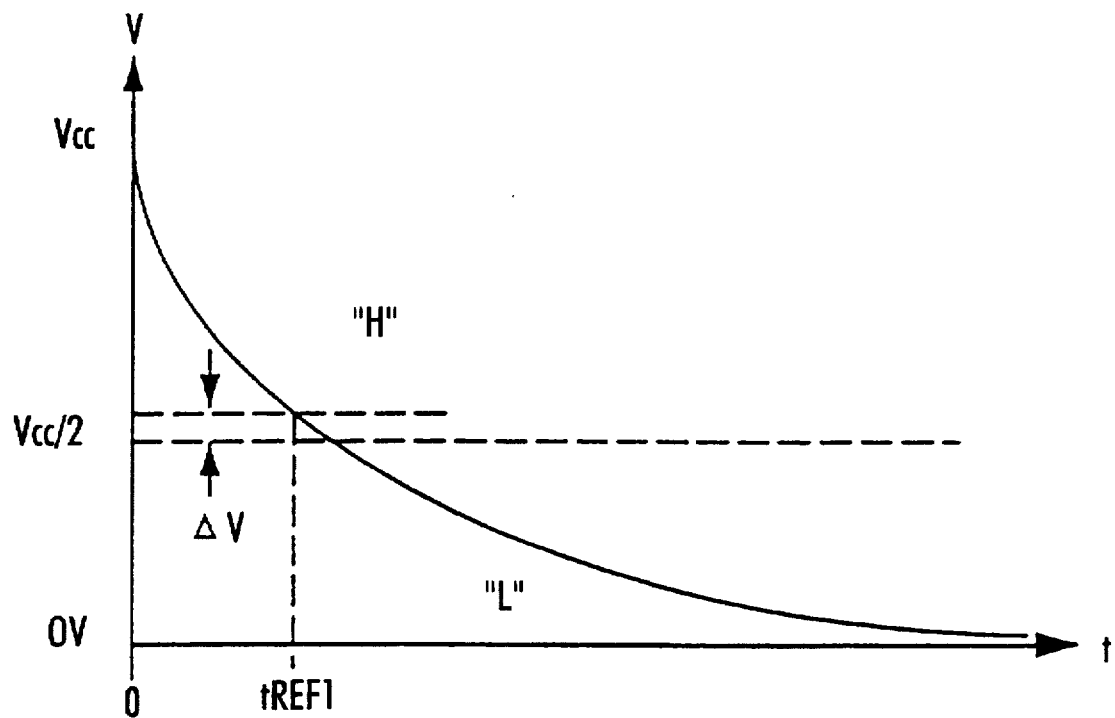
FIG. 28 is a graph showing potential change in a storage node of the memory cell shown in FIGS. 26 and 27.

($e^{YV-1}$) which is a current component common to equations (1) and (2) has characteristics shown in FIG. 25. The graph of FIG. 25 has current value I flowing to the diode of the PN junction (+ side is forward current, − side is reverse current) is plotted along the ordinate, and bias voltage value V applied to the PN junction (+ side is forward bias voltage, − side is reverse bias voltage) plotted along the abscissa.

Since current component ($e^{YV-1}$) varies according to the concentration Y of the impurity region, the characteristics shown in FIG. 25 can also vary according to coefficient Y. The leakage current in a memory cell is the reverse current of FIG. 25.

The equations of (1) and (2) show that current I flowing out from the region below the lower electrode of the capacitor and current I2 flowing thereto are determined by the impurity concentration and the bias voltage of the PN junction region (electric current path).

Therefore, reduction of the stored charge in a memory cell can be suppressed by defining and adjusting the above-described impurity concentration and bias voltage such that currents I1 and I2 are in balance. Preferably, current I2 is set equal to current I2.

A specific method of adjusting the bias voltage and the impurity concentration will be described hereafter. First adjustment of bias voltage will be described.

In order to prevent reduction of the stored charge in a memory cell due to leakage current, it is necessary to generate current flowing from the region connected beneath the storage node, and the current flowing thereto. For example, taking the region where source/drain region 22 and impurity region 24 of the DRAM of FIG. 12 are formed as typical examples, it is necessary to set the voltage between source/drain region 22 and body region 23 as a reverse bias voltage, and the voltage between impurity region 24 and impurity region 25 also as a reverse bias voltage.

To obtain such reverse bias voltages, the voltage of each region is to be set as follows. In the case where a voltage of a Vcc level is written into the memory capacitor, body region 23 is set to 0 V, and impurity region 25 is set to 2.Vcc.

In this case, the above-described condition of a reverse bias voltage is established since source/drain region 22 and impurity region 24 are both of the Vcc level. As practical voltage values, body region 23 is set to 0 V or −1 V, and impurity region 25 is set to 2.Vcc or more.

A specific adjustment of the bias voltage is as follows. When f1(P, $N^+$)=f2($P^+$, N) and Y1=Y2 in equations (1) and (2), V1=V2. In theory, the current value becomes I1=I2, to prevent reduction of the stored charge in a memory cell.

The above-described method of adjusting a bias voltage is only a way of example, and the present invention is not limited to such an adjustment method. Any condition substantially equal to that described above allows suppression of reduction of the stored charge due to leakage current.

A method of adjusting the impurity concentration will be described. It is considered that the optimum adjustment of the impurity concentration satisfies the following conditions of (a)–(c). In the following conditions of (a)–(c), C23, C22, C24 and C25 show the impurity concentrations of body region 23, source/drain region 22, impurity region 24, and impurity region 25, respectively.

(a) C23=C25 and C22=C24

(b) |C23|×|C22|=|C24|×|C25|

(c) C22=C24 where C23<C22 and C24>C25

When the condition of (a) is satisfied, the values of currents I1 and I2 shown in equations (1) and (2) are equal to each other. This is attributable to the characteristics that the leakage current flowing through a PN junction region is constant when the relationship between the impurity concentration of the N type region and that of the P type region is constant in an PN junction.

The values of currents I1 and I2 in equations (1) and (2) equal each other also in the case where the condition of (b) is satisfied. This is attributable to the characteristics that the leakage current flowing in an PN junction region is constant when the product of the absolute value of the impurity concentration of the P type region and the absolute value of the N type impurity region in the PN junction is constant according to certain constant conditions.

The values of currents I1 and I2 shown by the equations of (1) and (2) equal each other also in the case where the condition of (c) is satisfied. This is because the value of the leakage current is dependent upon the concentration of a region of the higher concentration when the concentration of the region of one type conductivity is higher than that of the region of the other type conductivity. Therefore, the values of currents I1 and I2 can be made equal since the impurity concentrations in two adjacent PN junction regions are equal to that of the higher region.

Respective concentrations of source/drain region 22 and impurity region 24 are increased to facilitate ohmic contact of storage node 51a with source/drain region 24 and impurity region 24. Furthermore, a higher concentration improves the conductivity between source/drain region 22 and impurity region 24.

Although the above method of adjusting the impurity concentration exemplifies the optimum conditions, the present invention is not limited to these conditions. Reduction of the stored charge in a memory cell due to leakage current can be suppressed as long as conditions close to such conditions is satisfied.

Although the method of adjusting the bias voltage and the method of adjusting the impurity concentration was described discretely, each of the method of adjusting the bias voltage and each of the method of adjusting the impurity concentration may be combined. In practical usage, adjustment of leakage current by such a combination is carried out. An example of adjusting leakage current by a combination will be described hereinafter.

The relationship of the impurity concentration is adjusted to satisfy the condition of C23<C25<C22, C24, and the reverse bias voltage is adjusted so as to satisfy the condition of V1>V2. In equations (1) and (2), f1(P, N⁺)<f2(P⁺, N). The reverse bias voltage must be set to V1>V2 in order to balance current I1 with current I2.

As shown in FIGS. 21 or 23, such adjustment of reverse bias voltage can be realized by adjusting the potential of the impurity region below the field shield gate electrode by potential supply circuit 101, as well as adjustment of the potential of the body region below the transfer gate electrode by potential supply circuit 102.

However, it is to be noted that increase in the potential of the body region beneath the transfer gate electrode causes a possibility of reduction in the performance of the transfer gate transistor. Therefore, it is preferable to adjust mainly the potential of the impurity region beneath the field shield gate electrode in practical usage.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of manufacturing semiconductor memory device comprising:
   an SOI substrate including
      (a) an insulation layer buried therein, and
      (b) an SOI active layer formed on said insulation layer,
   a word line formed on said SOI substrate,
   a bit line formed on said SOI substrate, and crossing said word line,
   a first region of a first type conductivity formed within said SOI active layer,
   a transistor including
      (a) a first source/drain region of a second type conductivity formed within said SOI active layer, and adjacent to said first region,
      (b) a body region of the first type conductivity formed within said SOI active layer, and adjacent to said first source/drain region,
      (c) a second source/drain region of the second type conductivity formed within said SOI active layer, adjacent to said body region, and coupled to said bit line,
      (d) a gate insulation film formed on said body region, and
      (e) a gate electrode formed on said gate insulation film, and coupled to said word line,
   a capacitor including
      (a) a storage node formed on said first region and said first source/drain region in common,
      (b) a dielectric film formed on said storage node, and
      (c) a cell plate formed on said dielectric film,
   a second region of the second type conductivity formed within said SOI active layer, and adjacent to said first region, a field shield insulation film formed on said second region, and
   a field shield electrode formed on said field shield insulation film;
   said manufacturing method comprising the steps of:
   forming said field shield electrode on a predetermined region of said SOI active layer with said field shield insulation film therebetween,
   doping first conductivity type impurities into said SOI active layer using said field shield electrode as a mask to form a diffusion region of the first type conductivity,
   forming a gate electrode on a first predetermined region of said diffusion region with said gate insulation film therebetween,
   forming a mask layer covering a second predetermined region adjacent to said field shield electrode of said diffusion region between said field shield electrode and said gate electrode, and
   doping second conductivity type impurities into said SOI active layer using said mask layer and said gate electrode as a mask to form said first and second source/drain regions.

2. The manufacturing method according to claim 1, wherein said mask layer comprises a photoresist covering said field shield electrode in addition to a predetermined region adjacent to said field shield electrode.

3. The manufacturing method according to claim 1, wherein said mask layer comprises a sidewall insulation film formed on a sidewall of said field shield electrode.

4. A method of manufacturing semiconductor device comprising an SOI substrate including an insulation layer buried therein, and an SOI active layer of a first type conductivity formed on said insulation layer, said manufacturing method comprising the steps of:
   forming a first insulation film on a predetermined region of said SOI active layer,
   forming a first electrode on said first insulation film,
   doping second conductivity type impurities into said SOI active layer using said first electrode as a mask to form a first diffusion region of a second type conductivity,
   forming a second insulation film on a first predetermined region of said first diffusion region,
   forming a second electrode on said second insulation film,
   forming a mask layer covering a second predetermined region adjacent to said first electrode of said first diffusion region between said first and second electrodes,
   doping first conductivity type impurities into said SOI active layer using said mask layer and said second electrode as a mask to form a second diffusion region of the second type conductivity,
   removing said mask layer,
   forming a node electrically floating on said second diffusion region and said second predetermined region of said first diffusion region.

5. The manufacturing method according to claim 4, wherein said mask layer comprises a photoresist covering said first electrode in addition to said second predetermined region of said diffusion region.

6. The manufacturing method according to claim 4, wherein said mask layer comprises a sidewall insulation film formed on a sidewall of said first electrode.

* * * * *

UNITED STATES PATENT AND TRADEMARK OFFICE
CERTIFICATE OF CORRECTION

PATENT NO. : 5,893,728
DATED : April 13, 1999
INVENTOR(S) : Hideto HIDAKA

It is certified that error appears in the above-identified patent and that said Letters Patent is hereby corrected as shown below:

Claim 1, line 45, change "a gate" to --said gate--;and

Claim 5, line 4, before "diffusion" insert --first--

Signed and Sealed this

Nineteenth Day of October, 1999

Attest:

Q. TODD DICKINSON

*Attesting Officer*   *Acting Commissioner of Patents and Trademarks*